United States Patent
Schmitt

(10) Patent No.: US 10,739,165 B2
(45) Date of Patent: Aug. 11, 2020

(54) MAGNETIC FIELD SENSOR

(71) Applicant: Analog Devices Global, Hamilton (BM)

(72) Inventor: Jochen Schmitt, Biedenkopf (DE)

(73) Assignee: Analog Devices Global, Hamilton (BM)

( * ) Notice: Subject to any disclaimer, the term of this patent is extended or adjusted under 35 U.S.C. 154(b) by 51 days.

(21) Appl. No.: 15/801,831

(22) Filed: Nov. 2, 2017

(65) Prior Publication Data
US 2019/0011287 A1 Jan. 10, 2019

Related U.S. Application Data

(60) Provisional application No. 62/528,872, filed on Jul. 5, 2017.

(51) Int. Cl.
*G01D 5/16* (2006.01)
*G01R 33/00* (2006.01)
(Continued)

(52) U.S. Cl.
CPC .............. *G01D 5/16* (2013.01); *G01D 5/147* (2013.01); *G01R 15/205* (2013.01);
(Continued)

(58) Field of Classification Search
CPC .... G01R 15/205; G01R 33/09; G01R 33/093; G01R 33/091; G01R 19/0092;
(Continued)

(56) References Cited

U.S. PATENT DOCUMENTS

| | | |
|---|---|---|
| 4,296,447 A | 10/1981 | Lewis |
| 5,243,403 A | 9/1993 | Koo et al. |

(Continued)

FOREIGN PATENT DOCUMENTS

| | | |
|---|---|---|
| CN | 1417872 A | 5/2003 |
| CN | 100443914 C | 12/2008 |

(Continued)

OTHER PUBLICATIONS

AN211 Application Note: Applications of Magnetic Position Sensors, Honeywell Sensor Products, 8 pages, 01-02 Rev. Printed on Jul. 29, 2013. Downloaded from: http://www51.honeywell.com/aero/common/documents/Applications-of-Magnetic-Position-Sensors.pdf.

(Continued)

*Primary Examiner* — Vinh P Nguyen
(74) *Attorney, Agent, or Firm* — Knobbe, Martens, Olson & Bear, LLP

(57) ABSTRACT

A magnetic field sensor is disclosed. The magnetic field sensor includes a first magnetoresistive element and a second magnetoresistive element arranged as a half bridge. The magnetic field sensor also includes two or more conductors adjacent to the first magnetoresistive element and the second magnetoresistive element. The two or more conductors can carry a bias current and a compensation current such that the bias current and the compensation current flow in the same direction adjacent to the first magnetoresistive element while the bias current and the compensation current flow in opposite directions adjacent to the second magnetoresistive element.

20 Claims, 32 Drawing Sheets

(51) Int. Cl.
*G01R 15/20* (2006.01)
*G01R 33/09* (2006.01)
*G01D 5/14* (2006.01)

(52) U.S. Cl.
CPC ..... *G01R 33/0017* (2013.01); *G01R 33/0029* (2013.01); *G01R 33/0035* (2013.01); *G01R 33/0082* (2013.01); *G01R 33/096* (2013.01)

(58) Field of Classification Search
CPC .... G01R 15/207; G01R 33/096; G01R 33/02; G01R 33/0023; G01R 33/06; G01R 15/202; G01R 33/00; G01R 33/07; G01R 15/18; G01R 33/05; G01R 33/0082; G01R 15/146; G01R 19/0084; G01R 19/165; G01R 31/3274; G01R 31/3277; G01R 33/0041; G01R 33/1207; G01R 33/1215; G01R 33/123; G01R 17/105; G01R 19/10; G01R 19/32; G01R 31/006; G01R 33/0017; G01R 33/063; G01R 33/072; G01R 33/095; G01R 7/02; G01D 5/16; G01D 5/147; G01D 5/145; G01D 5/24438; G01D 15/00; G01D 1/00; G01D 21/00; G01D 21/02; G01D 5/12; G01D 5/142

See application file for complete search history.

(56) References Cited

U.S. PATENT DOCUMENTS

| | | | |
|---|---|---|---|
| 5,351,005 A | 9/1994 | Rouse | |
| 5,521,501 A * | 5/1996 | Dettmann | G01R 33/09 324/207.12 |
| 5,621,377 A | 4/1997 | Dettman et al. | |
| 6,064,202 A | 5/2000 | Steiner et al. | |
| 6,335,081 B1 | 1/2002 | Araki et al. | |
| 6,373,247 B1 | 4/2002 | Marx | |
| 6,433,545 B1 * | 8/2002 | Kunze | G01R 33/09 324/207.21 |
| 6,727,563 B1 | 4/2004 | Hohe et al. | |
| 6,768,301 B1 | 7/2004 | Hohe et al. | |
| 7,602,176 B2 | 10/2009 | Butzmann | |
| 7,656,630 B2 | 2/2010 | Bonvalot et al. | |
| 7,746,065 B2 | 6/2010 | Pastre et al. | |
| 7,818,890 B2 | 10/2010 | Duric et al. | |
| 7,969,149 B2 | 6/2011 | Shoji | |
| 8,058,864 B2 | 11/2011 | Sheller et al. | |
| 8,125,221 B2 | 2/2012 | Muthers | |
| 8,587,299 B2 * | 11/2013 | van Veldhoven | G01R 33/096 324/207.21 |
| 8,593,134 B2 | 11/2013 | Haratani et al. | |
| 8,664,941 B2 | 3/2014 | Sebastiano et al. | |
| 8,680,850 B2 | 3/2014 | Zieren et al. | |
| 8,680,856 B2 | 3/2014 | Schmitt | |
| 9,170,281 B2 | 10/2015 | Hayashi et al. | |
| 9,261,570 B2 | 2/2016 | Obana et al. | |
| 9,310,446 B2 | 4/2016 | Kubik | |
| 2002/0180431 A1 | 12/2002 | Torok | |
| 2003/0151406 A1 | 8/2003 | Wan et al. | |
| 2004/0111906 A1 | 6/2004 | Abe | |
| 2008/0088996 A1 | 4/2008 | Bonvalot et al. | |
| 2008/0186635 A1 | 8/2008 | Takenaga et al. | |
| 2009/0051353 A1 | 2/2009 | Takeya et al. | |
| 2009/0189601 A1 | 7/2009 | Okada | |
| 2009/0212771 A1 | 8/2009 | Cummings et al. | |
| 2010/0264909 A1 | 10/2010 | Sheller et al. | |
| 2010/0321010 A1 | 12/2010 | van Veldhoven et al. | |
| 2011/0018533 A1 | 1/2011 | Cesaretti et al. | |
| 2011/0031960 A1 | 2/2011 | Hohe et al. | |
| 2012/0081111 A1 | 4/2012 | Kim et al. | |
| 2012/0165656 A1 | 6/2012 | Montag | |
| 2013/0049748 A1 | 2/2013 | Sebastiano et al. | |
| 2013/0099783 A1 | 4/2013 | Kubik | |
| 2013/0320972 A1 | 12/2013 | Loreit et al. | |
| 2014/0111192 A1 | 4/2014 | Kubik | |
| 2015/0002142 A1 | 1/2015 | Kubik | |
| 2015/0091560 A1 | 4/2015 | Deak et al. | |
| 2015/0285873 A1 | 10/2015 | Cai | |
| 2016/0146859 A1 * | 5/2016 | Futakuchi | G01R 15/205 324/117 R |
| 2016/0313411 A1 | 10/2016 | Koike | |
| 2016/0313413 A1 | 10/2016 | Mohan et al. | |
| 2017/0131368 A1 | 5/2017 | Kubik | |
| 2017/0276514 A1 | 9/2017 | Schmitt et al. | |
| 2017/0276740 A1 | 9/2017 | Schmitt et al. | |
| 2017/0322052 A1 | 11/2017 | Paul | |

FOREIGN PATENT DOCUMENTS

| | | |
|---|---|---|
| CN | 102073023 A | 5/2011 |
| CN | 102099695 A | 6/2011 |
| CN | 102292648 A | 12/2011 |
| CN | 102428381 | 4/2012 |
| CN | 102565727 | 7/2012 |
| CN | 103267955 A | 8/2013 |
| CN | 103959080 A | 7/2014 |
| CN | 105143902 A | 12/2015 |
| CN | 105629023 A | 6/2016 |
| CN | 106662622 A | 5/2017 |
| DE | 4438715 | 5/1996 |
| DE | 4438715 C1 | 5/1996 |
| DE | 19648879 | 11/1996 |
| DE | 19722834 | 5/1997 |
| DE | 19839450 A1 | 3/2000 |
| DE | 10243645 | 6/2004 |
| DE | 102004056384 | 2/2006 |
| DE | 102005037036 | 4/2007 |
| DE | 102009006144 A1 | 10/2009 |
| DE | 112008001024 B4 | 2/2010 |
| DE | 112010000890 T5 | 9/2012 |
| DE | 102005009923 | 11/2016 |
| EP | 0707218 | 8/1995 |
| EP | 1467218 | 10/2004 |
| EP | 1 566 651 | 8/2005 |
| EP | 2671091 | 12/2014 |
| JP | 2003-511672 | 3/2003 |
| JP | 2005-136134 | 5/2005 |
| JP | 2005-517937 | 6/2005 |
| JP | 2008-503778 | 2/2008 |
| JP | 2009-250931 | 10/2009 |
| JP | 2010-130325 | 6/2010 |
| JP | 2014-85339 | 5/2014 |
| KR | 20040081200 | 9/2004 |
| WO | WO 2009/058290 | 5/2009 |
| WO | WO 2011/136054 | 11/2011 |
| WO | WO 2012/103950 | 8/2012 |
| WO | WO 2013/129276 | 9/2013 |
| WO | WO 2015/011052 | 1/2015 |
| WO | WO 2015/175087 | 11/2015 |

OTHER PUBLICATIONS

AS5030 Datasheet, 44 pages, © 1997-2013; ams AG; printed on Jul. 29, 2013 from: http://www.ams.com/eng/content/download/11929/212604/file/AS5030_Datasheet_v2-4.pdf.

Axel Bartos, Principle of a 360° Measurement Utilizing HL Planar's Sensor KMR360, HLPLANAR Technik, Jan. 18, 2005, 10 pages. Originally available from: http://www.hlplanar.de.

Bilotti et al.; "Monolithic Magnetic Hall Sensor Using Dynamic Quadrature Offset Cancellation," IEEE Journal of Solid-State Circuits; vol. 32, Issue 6; Jun. 1997; pp. 829-836.

Caruso, et al..; "A New Perspective on magnetic Field Sensing," May 1998, Honeywell, Inc.

KMA221 Programmable angle sensor product data sheet, Jul. 16, 2013, NXP B.V., downloaded from: http://www.nxp.com/documents/data_sheet/KMA221.pdf.

KMZ43T Magnetic Field Sensor Product data sheet, NXP B.V., Mar. 4, 2009, 8 pages, online, retrieved from the Internet at: <URL: http://www.nxp.com/documents/data_sheet/KMZ43T.pdf>.

(56) References Cited

OTHER PUBLICATIONS

Macintyre, Steven A., "Macintyre Electronic Design: Magnetic Field Measurement," Copyright 1999 by CRC Press, LLC.
Magnetic Displacement Sensors, HMC1501/1512, Honeywell, 8 pages, Dec. 2010, downloaded from: http://www51.honeywell.com/aero/common/documents/myaerospacecatalog-documents/Missiles-Munitions/HMC1501-1512.pdf.
Magnetic Field Sensor KMR 360, HLPLANAR Technik, *HL-Planartechnik GmbH* 4 pages, online, retrieved from the Internet at: <URL: http://www.meas-spec.cn/manage/sensortypes/KMR360eng.pdf, May 12, 2003>.
Patterson, Mark, "Hall Effect and Magnetoresistance," University of Dayton, Feb. 27, 2007 in 9 pages.
Office Action dated Nov. 11, 2019 for Japanese Patent Application No. 2018-127431.
Chinese Office Action issued in application No. 201810726983.5 dated May 20, 2020.
The Research and Application of Dual-axis Magnetoresistive Sensor Based on HMC1022 (Aug. 15, 2009).

\* cited by examiner

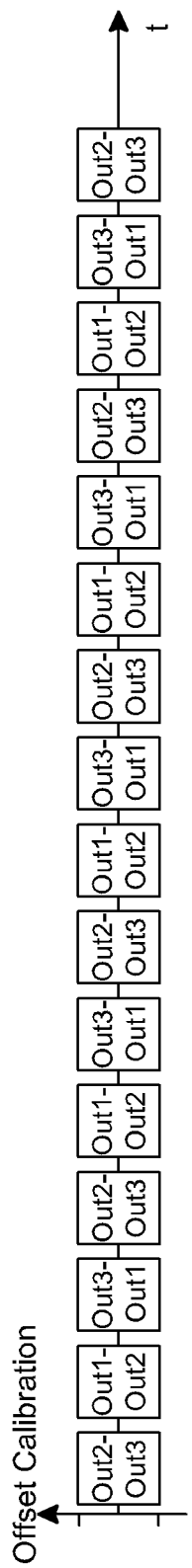
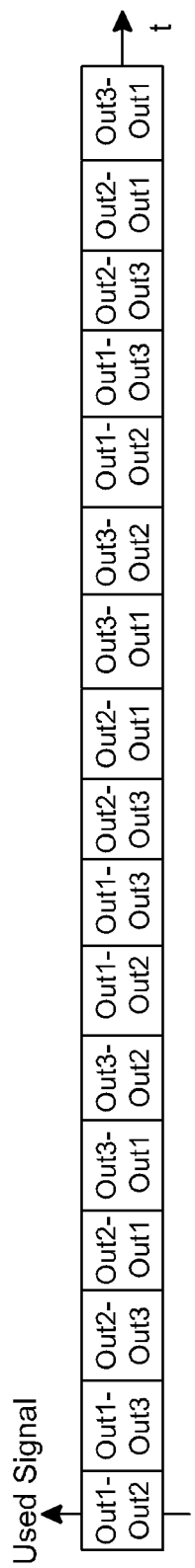
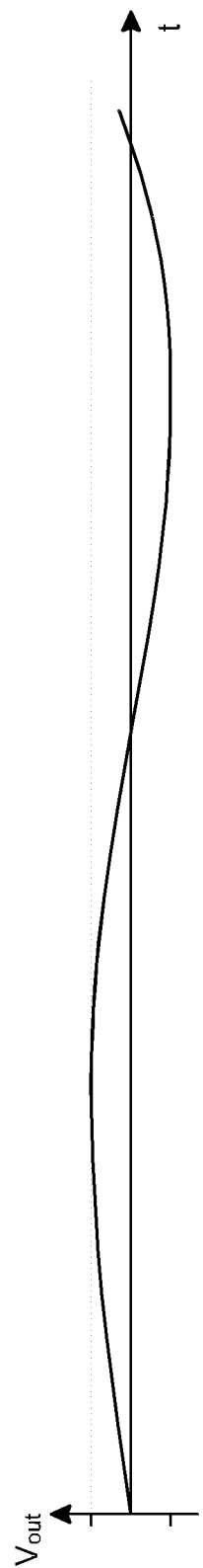
FIG. 32A
FIG. 32B
FIG. 32C

MAGNETIC FIELD SENSOR

CROSS-REFERENCE TO RELATED APPLICATION

This application claims the benefit of U.S. Provisional Application No. 62/528,872, entitled "MAGNETIC FIELD SENSOR," filed Jul. 5, 2017, the entire disclosure of which is incorporated herein by reference for all purposes.

FIELD OF THE DISCLOSURE

This disclosure generally relates to electronics. In particular, the disclosure relates to magnetic field sensors.

BACKGROUND

Magnetic field direction detectors, of the type described herein, can be used to resolve the direction of a magnetic field into one of a couple or several sectors. This can be useful to resolve ambiguity from angular position sensors using magnets to track the rotary motion of an object. Such objects can include, for example, steering wheels, camshafts, crankshafts, wheels/tires, hubs, rotors, and the like. The rotational information can be used for antilock braking systems, for traction control, engine camshaft control, ignition and/or fuel injection timing, and the like.

Magnetic field sensors can sense a magnetic field. A differential magnetic field sensor can be used to sense current. For instance, two magnetically sensitive elements can be arranged in a way that they generate the same output signal for homogeneous fields and a differential output for field gradients.

SUMMARY OF THE DISCLOSURE

The innovations described in the claims each have several features, no single one of which is solely responsible for its desirable attributes. Without limiting the scope of the claims, some prominent features of this disclosure will now be briefly described.

In one aspect, a magnetic field sensor is disclosed. The magnetic sensor can include a first magnetoresistive element and a second magnetoresistive element arranged as a half bridge. The magnetic field sensor can also include two or more conductors adjacent to the first magnetoresistive element and the second magnetoresistive element. The two or more conductors are configured to carry a bias current and a compensation current such that the bias current and the compensation current flow in the same direction adjacent to the first magnetoresistive element while the bias current and the compensation current flow in opposite direction adjacent to the second magnetoresistive element.

In some embodiments, the magnetic field sensor is configured to sense a magnetic field. In some embodiments, the magnetic field sensor is configured to sense a differential magnetic field.

In some embodiments, the two or more conductors include a first conductor that is configured to carry the bias current and a second conductor that is configured to carry the compensation current. In some embodiments, the first magnetoresistive element and the second magnetoresistive element are included in a magnetoresistive layer and the first and second conductors are disposed on opposite sides of the magnetoresistive layer.

In some embodiments, the first magnetoresistive element includes a pair of spaced apart sub-magnetoresistive elements on two sides of the magnetic field sensor.

In some embodiments, the magnetic field sensor can further include a third magnetoresistive element and a fourth magnetoresistive element arranged as a second half bridge and a second half bridge compensation conductor that is configured to carry a second half bridge compensation current. In some embodiments, the magnetic field sensor can also include a fifth magnetoresistive element and a six magnetoresistive element arranged in as a third half bridge and a third half bridge compensation conductor that is configured to carry a third half bridge compensation current. In some embodiments, the magnetic field sensor is arranged to sense a magnetic field with outputs from the half bridge and the second half bridge while the third half bridge is being calibrated. In some embodiments, the two or more conductors include a first conductor that is configured to carry the bias current and a second conductor configured to carry the compensation current. The first conductor and the second half bridge compensation conductor are configured such that the bias current and the second half bridge compensation current flow in the same direction adjacent to the third magnetoresistive element while the bias current and the second half bridge compensation current floe in opposite directions adjacent the fourth magnetoresistive element. The first conductor and the third half bridge compensation conductor are configured such that the bias current and the third half bridge compensation current flow in the same direction adjacent to the fifth magnetoresistive element while the bias current and the third half bridge compensation current flow in opposite directions adjacent to the sixth magnetoresistive element.

In some embodiments, the two or more conductors can include a first conductor that is configured to carry a first combined current that includes a first combination of the bias current and the compensation current in which the bias current and the compensation current flow in the same direction, and a second conductor that is configured to carry a second combined current that includes a second combination of the bias current and the compensation current in which the bias current and the compensation current flow in opposite directions.

In some embodiments, the two or more conductors are arranged such that both the bias current and the compensation current flow along a longitudinal direction of the first magnetoresistive element.

In some embodiments, the magnetic field sensor can also include a third magnetoresistive element and a fourth magnetoresistive element. The first, second, third, and fourth magnetoresistive elements are arranged as a full bridge.

In some embodiments, the compensation current is configured to bring an offset of an output of the half bridge to proximately zero. In some embodiments, the first magnetoresistive element is an anisotropic magnetoresistance element. In some embodiments, the compensation current is based on an output of the half-bridge.

Another aspect of this disclosure is a magnetic field sensing system. The magnetic field sensing system can include a magnetic field sensor. The magnetic field sensor includes a first magnetoresistive element and a second magnetoresistive element arranged as a half bridge. The magnetic field sensor further includes two or more conductors configured to carry a bias current and a compensation current such that the bias current and the compensation current flow in the same direction adjacent to the first magnetoresistive element while the bias current and the compensation current flow in opposite directions adjacent to the second magnetoresistive element. The magnetic field sensing system can also include a bias current generating circuit that is configured to generate the bias current such that the bias current flips polarity during operation. The magnetic field sensing system can also include a compensation current generating circuit that is configured to generate the compensation current.

In some embodiments of the magnetic field sensing system, the compensation current generating circuit is configured to flip polarity of the compensation circuit at times corresponding to times when the bias current flips polarity.

In some embodiments, the magnetic field sensing system can also include a combining circuit to combine the bias current and the compensation circuit to generate a combined current and to provide the combined current to the magnetic field sensor.

Another aspect of this disclosure is a method of detecting a magnetic field is disclosed. The method includes biasing a first magnetoresistive element and a second magnetoresistive element of a half bridge with one or more bias currents such that the first magnetoresistive element has an opposite field sensitivity relative to the second magnetoresistive element. The method also includes applying a compensation current to perform a field compensation of the half bridge for linearization. The method also includes, associated with the biasing and the applying, detecting a magnetic field using the half bridge.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of the present disclosure will be described, by way of non-limiting example only, with reference to the accompanying drawings, in which:

FIG. 30B is a graph showing a first bias current in a first biasing conductor of the differential magnetic sensor on the vertical axis and the time on the horizontal axis.

FIG. 32A is a timing diagram showing timings for calibration in the differential magnetic field sensor of FIG. 29.

FIG. 32B is a timing diagram showing signals used for calibration in the differential magnetic field sensor of FIG. 29.

FIG. 32C shows an output voltage of a sensing system that includes the magnetic field sensor of FIG. 29.

DETAILED DESCRIPTION

Figure 1:
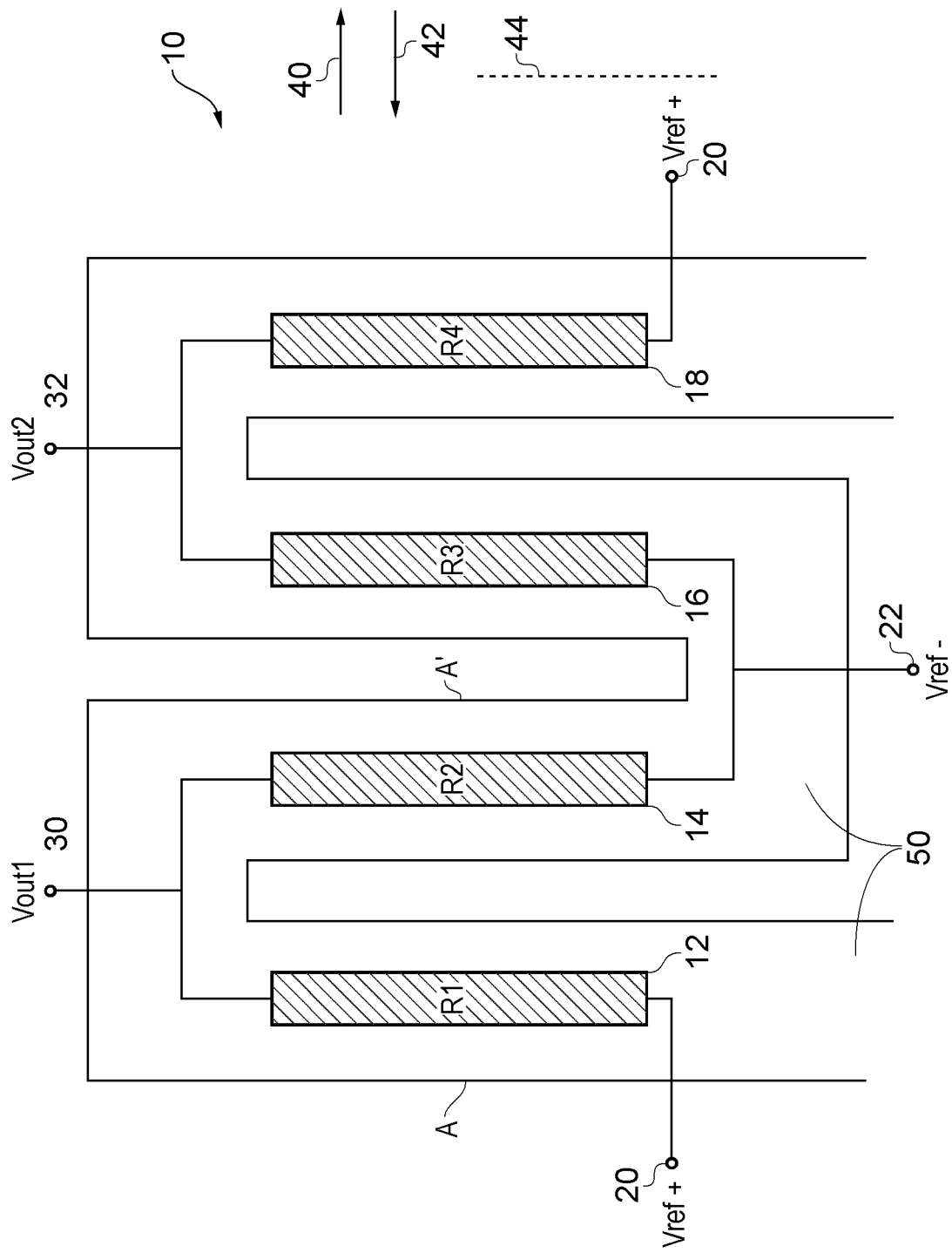
FIG. 1 is a schematic view of an embodiment of a magnetic field direction detector.

Various aspects of the novel systems, apparatuses, and methods are described more fully hereinafter with reference to the accompanying drawings. Aspects of this disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the novel systems, apparatuses, and methods disclosed herein, whether implemented independently of or combined with any other aspect. For example, an apparatus may be implemented or a method may be practiced using any number of the aspects set forth herein. In addition, the scope is intended to encompass such an apparatus or method which is practiced using other structure, functionality, or structure and functionality in addition to or other than the various aspects set forth herein. It should be understood that any aspect disclosed herein may be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to various systems and technologies, some of which are illustrated by way of example in the figures and in the following description of the preferred aspects. The detailed description and drawings are merely illustrative of the disclosure rather than limiting, the scope of the disclosure being defined by the appended claims and equivalents thereof.

In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1 is a plan view of a first embodiment of a magnetic field direction detector. The magnetic field direction detector 10 comprises first to fourth magneto-resistors 12, 14, 16 and 18 having respective resistances R1 to R4. The first and second magneto-resistors 12 and 14 are connected in series between a first reference node 20 and a second reference node 22. For convenience the first reference node 20 may, in use, be connected to receive a first reference voltage Vref+ and the second reference node may receive a second reference Vref−. These voltages may, advantageously, be provided by stabilized voltage references. Under circumstances where the reference voltages Vref+ and Vref− are well controlled, then a direction detector need only have one of the first and second magneto-resistors 12 and 14. However, for greater immunity to voltage variation, to detector temperature drift and for enhanced sensitivity it is advantageous to provide the third and fourth resistors 16 and 18, so as to form a bridge configuration as shown in FIG. 2.

Figure 2:
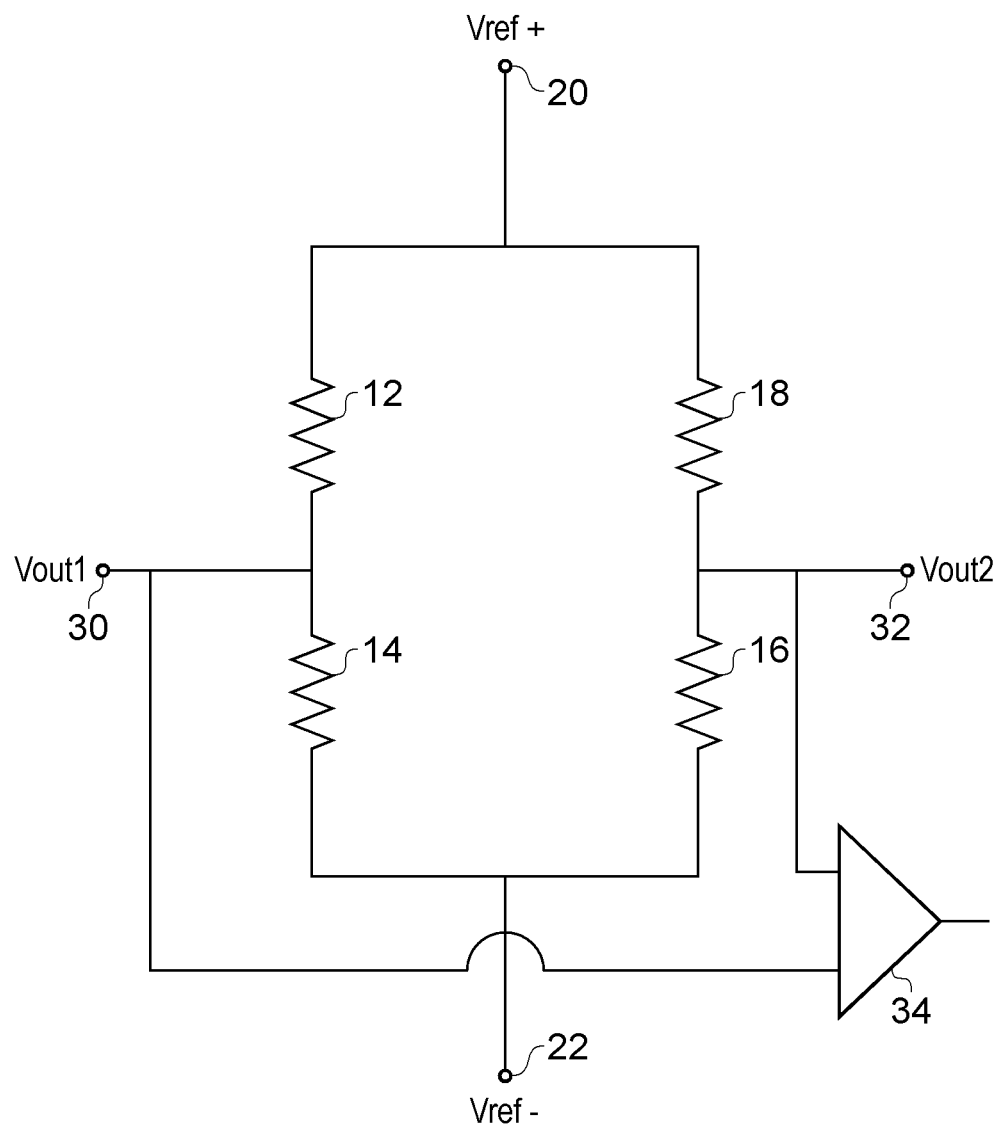
FIG. 2 is an equivalent circuit of the detector illustrated in FIG. 1.

Referring to FIG. 2, the bridge is formed by connecting a first end of the first magneto-resistor 12 to the first reference node 20 and a second end to a first output node 30 and to a first end of the second magneto-resistor 14. A second end of the second magneto-resistor 14 is connected to the second voltage reference node 22.

Similarly, a first end of the fourth resistor 18 is connected to the first reference node 20. A second end of the fourth resistor is connected to a second output node 32 and to a first end of the third magneto-resistor 16. A second end of the third magneto-resistor 16 is connected to the second reference node 22.

In use the output voltages at the first and second output nodes can be compared with each other to determine whether the magnetic field has a component that is in a first direction, designated by arrow 40 (FIG. 1), or a second direction 42 opposed to the first direction 40. Thus the sensor is responsive to the direction of a magnetic field with respect to a detection axis 44 and acts to determine if the magnetic field has a component of field from a first side or a second side of the detection axis. The comparison may be performed by a comparator or differential amplifier 34.

The first to fourth magneto-resistors 12 to 18 are disposed in a first plane that is offset from a second plane which carries a perturbation generator for perturbing the magnetic field at the magneto-resistors. The perturbation generator may be a magnetized piece of material so as to generate a permanent field. However, in the context of integrated circuits it is often more convenient to use an electric current flowing in a conductor to generate the perturbation. This has the advantage that the magnitude and direction of the perturbation can be changed by drive circuitry. This is useful when determining the sensitivity of the magnetic field direction detector, or when performing steps to enhance signal processing, such as auto-zeroing actions to measure and/or compensate for offsets occurring in amplifiers or comparators connected to the output terminals 30 and 32.

Figure 3:
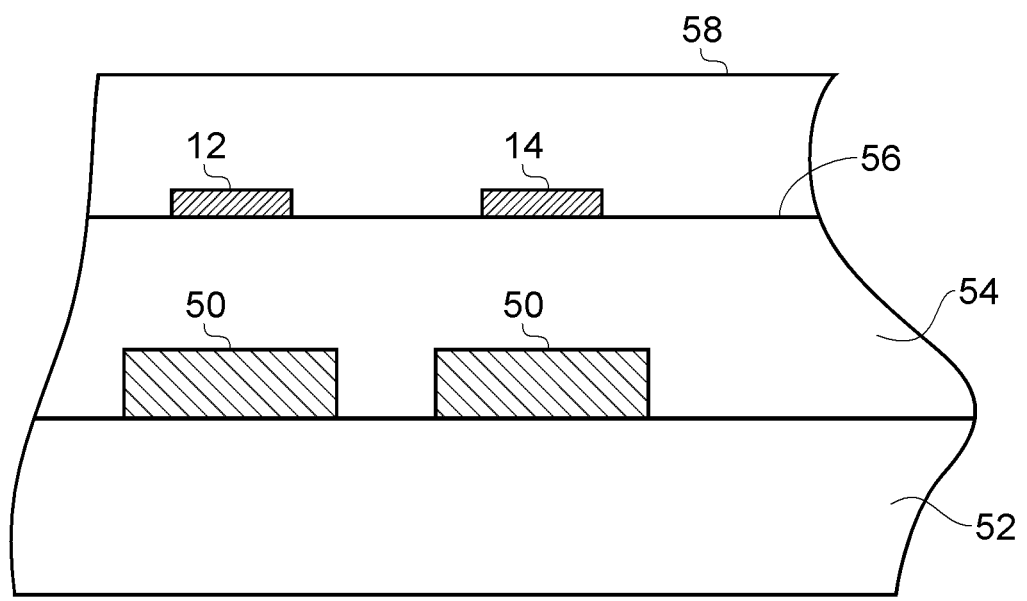
FIG. 3 is a cross section along the line A-A' of FIG. 1.

FIG. 3 is a cross section along the line A-A' of FIG. 1, and showing the first and second magneto-resistors 12 and 14, and the perturbation generator 50 formed by a conductive element. The conductive element is formed over a substrate, such as a silicon substrate 52 or a layer of an insulator, such as polyamide over a silicon substrate. The conductive element is itself surrounded by and embedded within an insulator 54, such as polyamide. The insulator 54 may, during manufacture of the magnetic field direction detector, be planarized so as to form a planar surface 56 over which the magneto-resistors 12 and 14 are deposited. The resistors are then enclosed in a protective layer 58 to protect them from environmental damage.

These steps are conventional to the person skilled in the art of device fabrication and need not be described here. It can be seen that with the magneto-resistors positioned as shown in FIG. 3, that they will be subjected to a magnetic flux due to current flowing in the conductor of the perturbation generator 50.

Returning to FIG. 1, it can be observed that the perturbation generator 50 has a folded path such that if the current flowing beneath the first magneto-resistor 12 has a first direction (say upwardly as shown in FIG. 1 and into the plane of the page of FIG. 3) then the current flowing beneath the second magneto-resistor 14 flows in an opposing direction (down the page of FIG. 1 and out of the plane of FIG. 3). Thus, when the perturbation generator 50 is carrying a current, different perturbing magnetic fields occur at the first magneto-resistor 12 and the second magneto-resistor 14.

Exactly the same effect also occurs at the third and fourth resistors 16 and 18.

Figure 4:
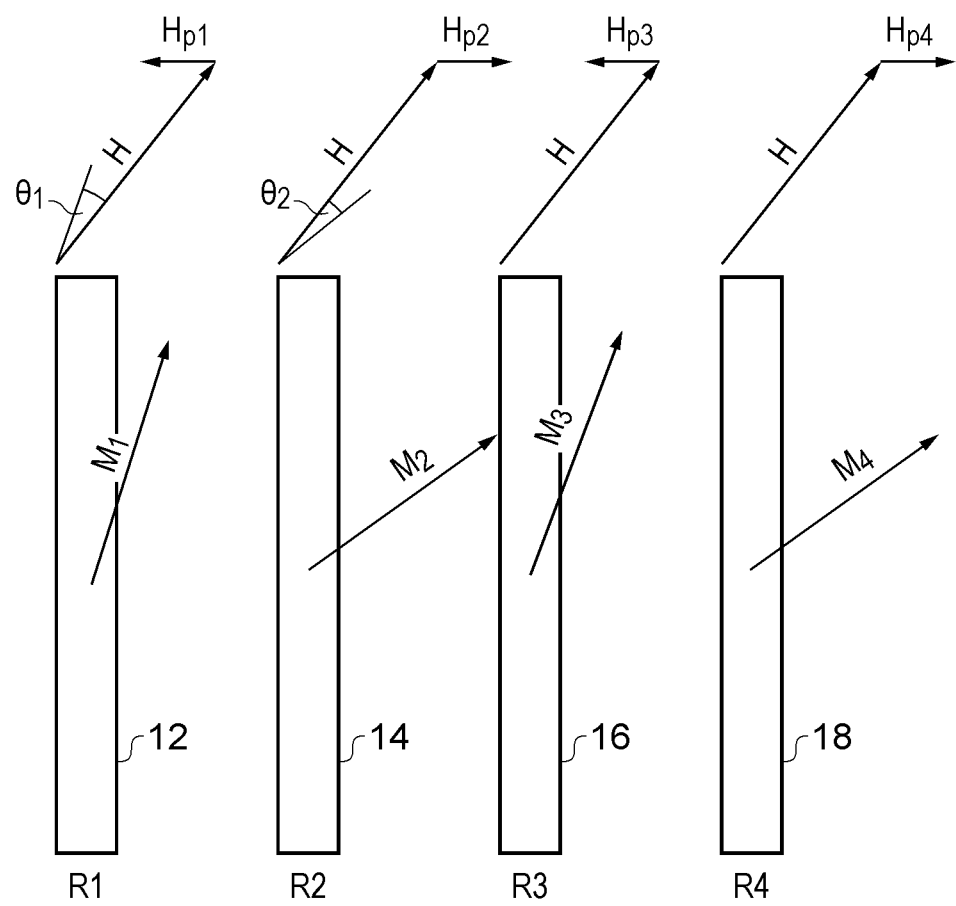
FIG. 4 is a vector diagram showing the vector addition of a perturbing magnetic field at each magneto-resistor to magnetic field whose direction is to be measured.

FIG. 4 schematically shows the vector addition of the perturbing magnetic field with an external magnetic field having a strength and direction illustrated by the vector "H". The perturbation at each magneto-resistor is represented by the vector $H_p$. In each instance the magnitude of $H_p$ has been shown as the same for each magneto-resistor but the direction for the first and third magneto-resistors is opposed to that for the second and fourth magneto-resistors.

The resultant vector sum is designated "M" for each resistor 12, 14, 16 and 18, and it can be seen that the direction of the resultant field $M_1$ for the first resistor 12 has changed by a first angle $\theta_1$ that differs from that of the resultant field $M_2$ for the second magneto-resistor 14 which has changed by a second angle $\theta_2$. Also, the magnitude of the vector sums $M_1$ and $M_2$ may differ.

The change in magnetic field direction and strength effects the resistances R1 to R4 of the first to fourth magneto-resistors 12, 14, 16 and 18, respectively, and each vector sum is rotated by a respective angle $\theta_1$ to $\theta_4$ with respect to H.

Figure 5:
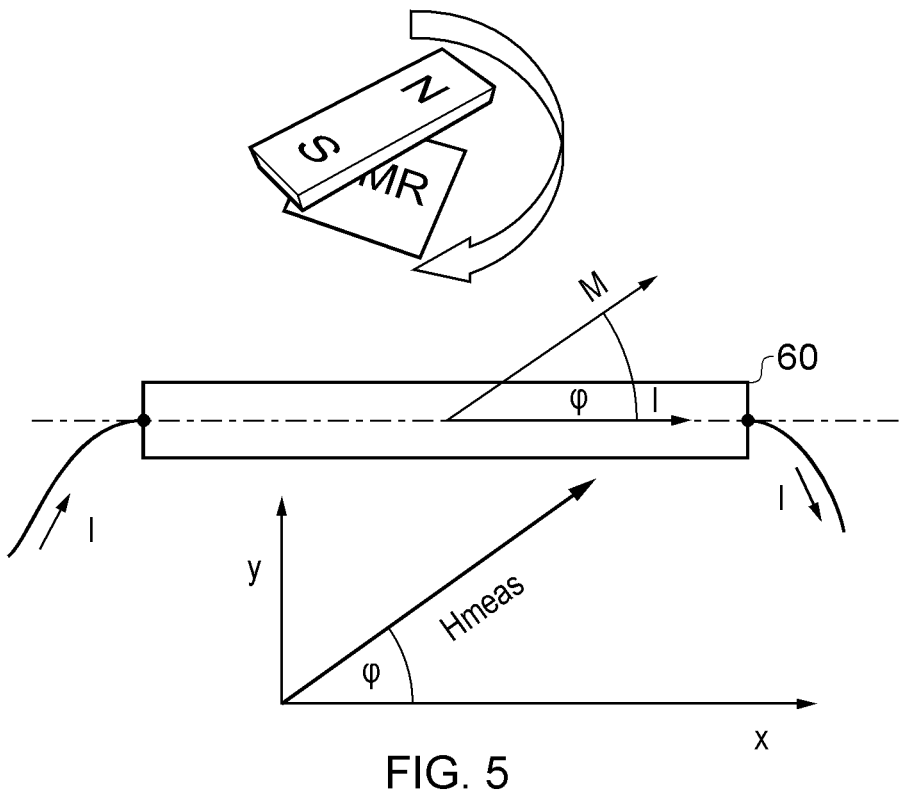
FIG. 5 is a diagram showing a frame of reference for measuring a direction between a magnetic field and a direction of current flow in a magneto-resistor.
Figure 6:
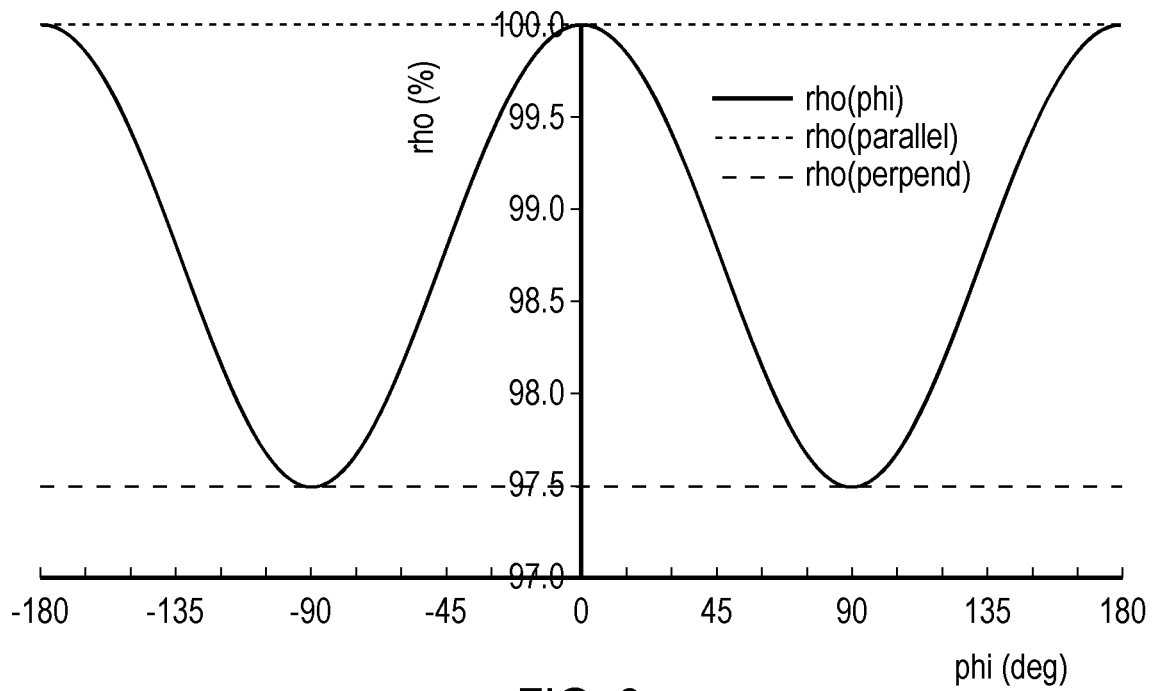
FIG. 6 is a graph showing variations in resistivity as a function of angle of the measured magnetic field to a direction of current flow.

FIG. 5 illustrates a frame of reference defining the angle $\varphi$ between the direction of current flow in an elongate and linear magneto-resistor 60 and a magneto-resistor magnetization vector M resulting from a surrounding magnetic field H, and FIG. 6 is a graph showing how bulk resistivity $\rho$ of the magneto-resistor varies with $\varphi$. It is known to the person skilled in the art that a sufficiently large magnetic field H causes the magnetization vector M to align with H. This is the mode of operation used in angular field sensors.

The features of note are that $\rho$ (rho) is at a minimum at ±90° and that the response is symmetric about ±90°. This effect can be exploited to increase the effective length of the magneto-resistor and hence increase sensitivity, by allowing a magneto-resistive sensor to be formed from magneto-resistive elements having opposing directions of current flow, as will be discussed later.

From comparing FIGS. 4 and 6, it is apparent that the resistance R1 of the first magneto-resistor 12 will be changed to different extent than that, R2, of the second magneto-resistor 14. In the example illustrated in FIG. 4 $M_2$ is at a higher angle $\rho$ (rho) than $M_1$ and hence R2<R1, assuming R1=R2 in the absence of any magnetic field. Similarly R4<R3. Therefore, for these resistors in a bridge configuration as shown in FIG. 2, $Vout_2 > Vout_1$ if the magnetic field has a component in the first direction 40, whereas $Vout_2 < Vout_1$ if the magnetic field has a component in the second direction 42.

The strength of the magneto-resistive response can be enhanced by using resistors that have an increased "length" compared to their "width". This can be achieved by forming a meandering or serpentine pattern in the material forming the magneto-resistors, or by forming each magneto-resistor of several series connected stripes or elements of magneto-resistive material. The stripes or elements of magneto-resistive material may be deposited parallel to one another.

Figure 7:
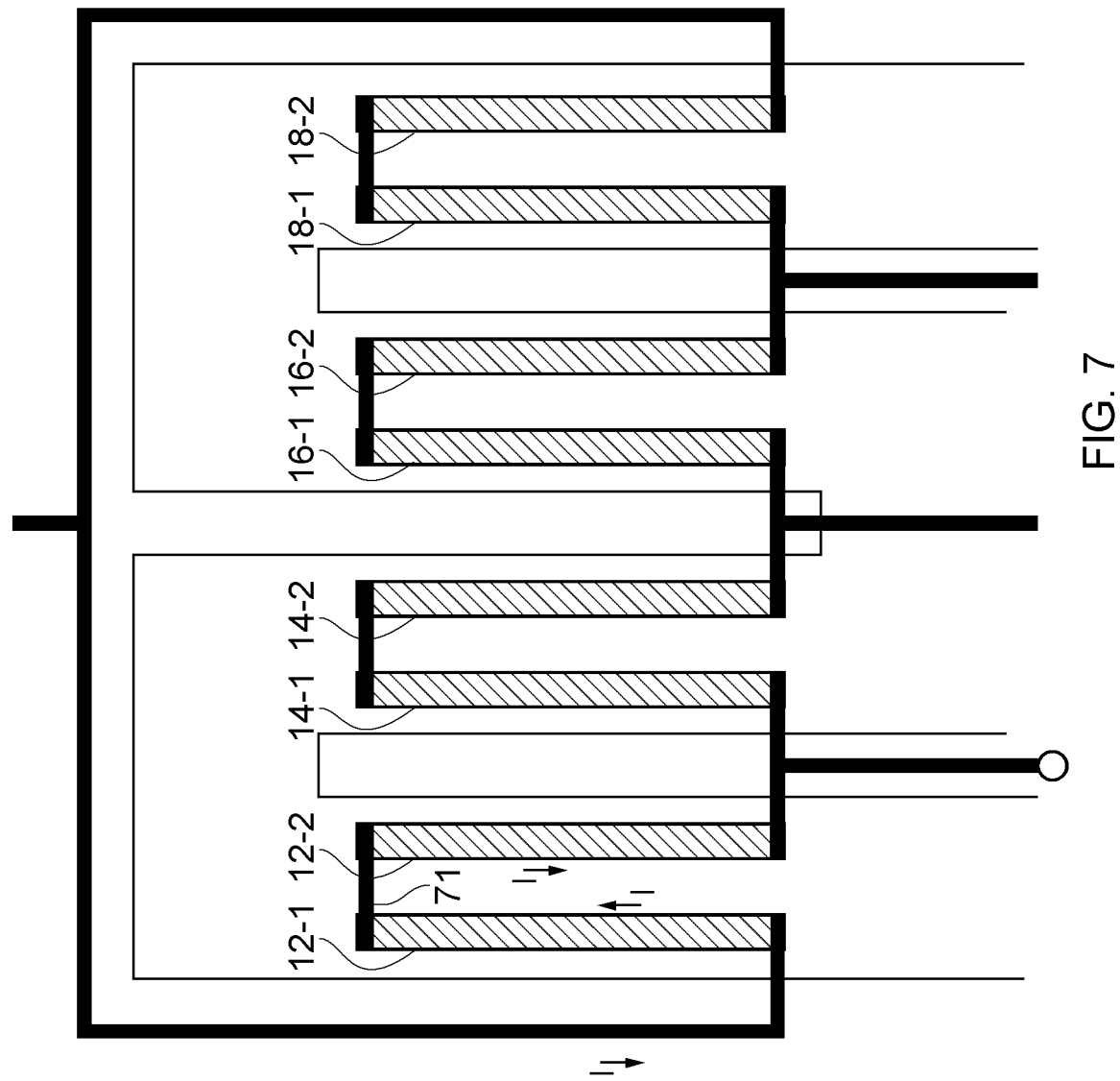
FIG. 7 is a plan view of a further embodiment of a magnetic field direction detector.

FIG. 7 shows in simplified form, a magnetic field direction detector where each magneto-resistor now comprises a plurality of interconnected magneto-resistive elements. Comparing FIG. 7 with FIG. 1, the first magneto-resistor 12 now comprises two magneto-resistive elements 12-1 and 12-2 connected together by way of a metallic link 71 which may be formed over the magneto-resistive material or formed in a layer intermediate the conductor of the perturbation generator 50 and the magneto-resistive elements, or may be part of the magneto-resistive material.

The other magneto-resistors are similarly formed by magneto-resistive elements 14-1, 14-2; 16-1, 16-2; 18-1 and 18-2.

Although the current flow is in opposite directions within the magneto-resistive element 12-2 compared to the current flow in element 12-1, the symmetry in the resistivity characteristic around the 90° direction means that the response of the two elements is identical. Each magneto-resistor 12, 14, 16 and 18 can be made of a plurality of magneto-resistive elements, e.g. two, three, four, five and so on. The resistance, and hence the resistance change, scales with the number of resistive elements.

The resistive elements have been drawn as linear elements, as this is both the simplest configuration and it is believed to be the most likely, but all embodiments of this disclosure are not so limited. Even when the external magnetic field is expected to be substantially linearly directional over the spatial existent of the direction detector, the magneto-resistors and the magneto-resistive elements forming them may take other geometries such as arcuate or zigzag. This may enhance the packing of the magnetic field direction detector onto a die containing other components.

Two magnetic field direction detectors can be used to form a quadrant detector, as will now be described.

Figure 8:
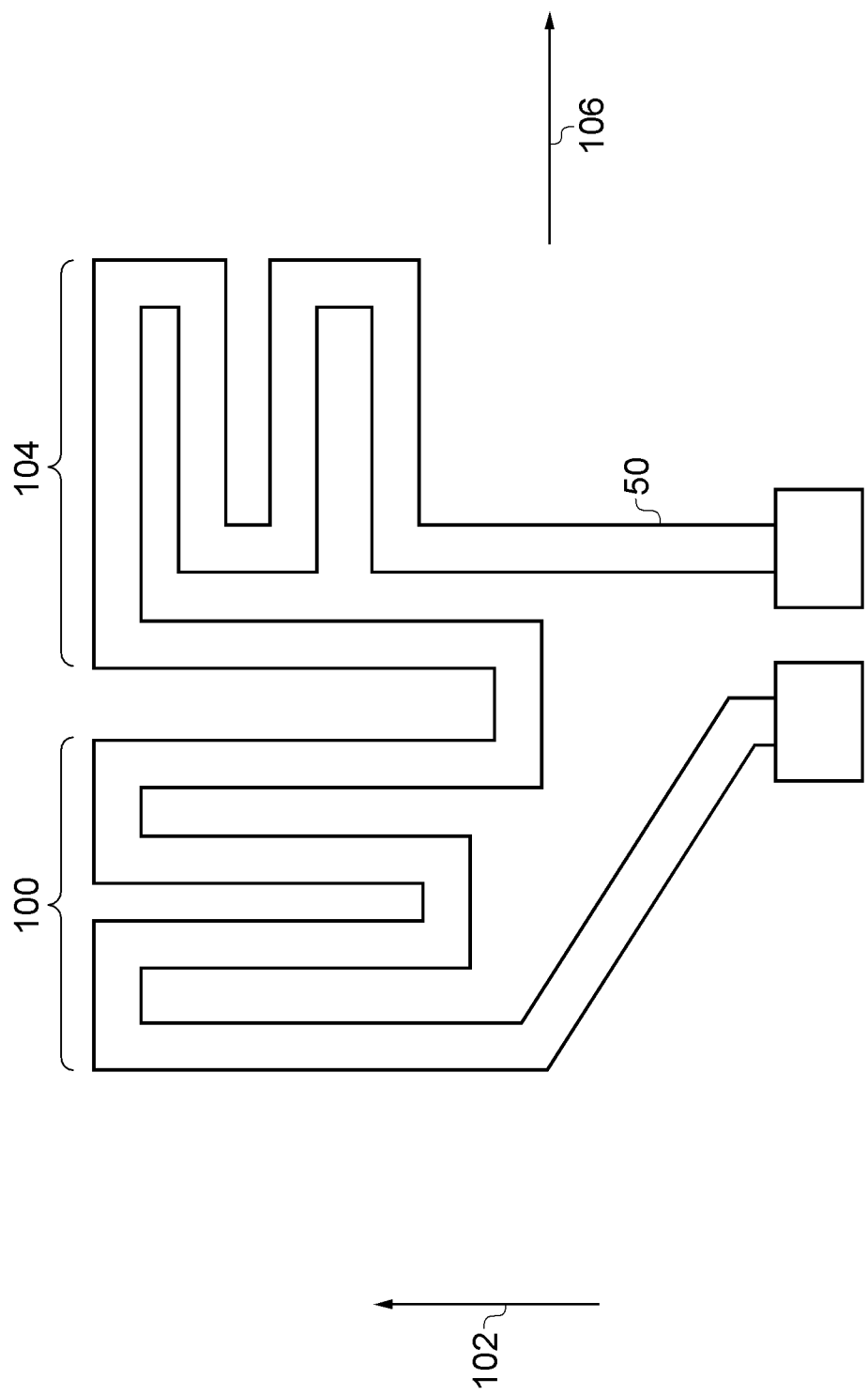
FIG. 8 is a plan view of a conductor acting as a perturbation generator for a quadrant detector constituting an embodiment.
Figure 9:
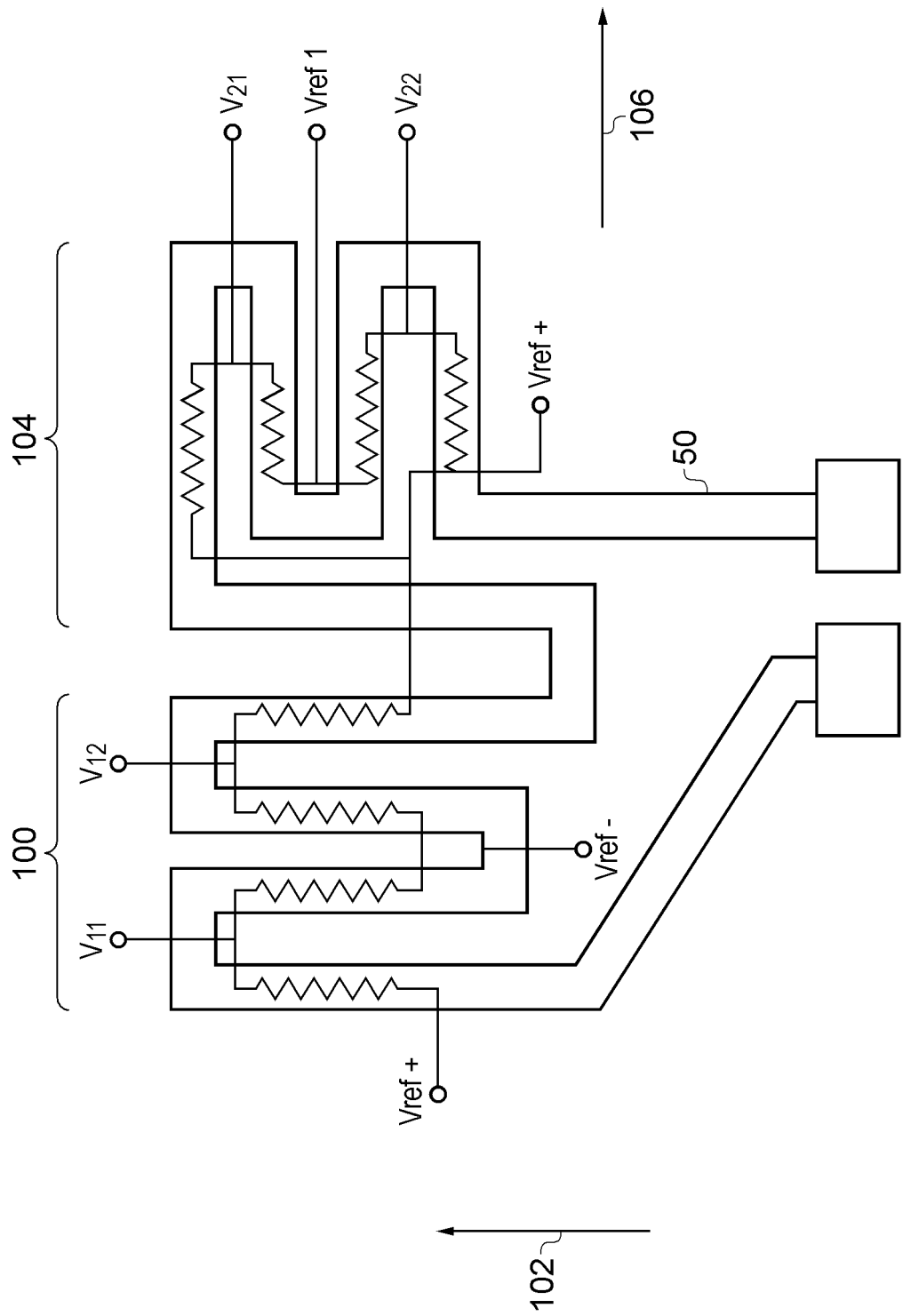
FIG. 9 is a plan view of the perturbation generator of FIG. 8 with the position of magneto-resistors and their interconnections diagrammatically superimposed.

FIG. 8 shows the path of a shared perturbation generator comprising a single conductor perturbation generator 50 for generating the magnetic perturbation in a first direction detector 100 having a detection axis along the direction of arrow 102, and a second direction detector 104 having a detection axis along the direction of arrow 106. Thus the magnitude and direction of the perturbing field can be controlled simultaneously in both magnetic field direction detectors. FIG. 9 is similar to FIG. 8, but also schematically indicates the positions of the first to fourth magneto-resistors in each direction detector 100 and 104 (the magneto-resistors may be made of a plurality of magneto-resistive elements as described with respect to FIG. 7).

A comparator, not shown, may be connected to the first and second outputs of the first direction detector 100 to compare $V_{11}$ with respect to $V_{12}$. Similarly a comparator connected to the outputs of the second bridge 104 may compare $V_{21}$ with respect to $V_{22}$.

Figure 10:
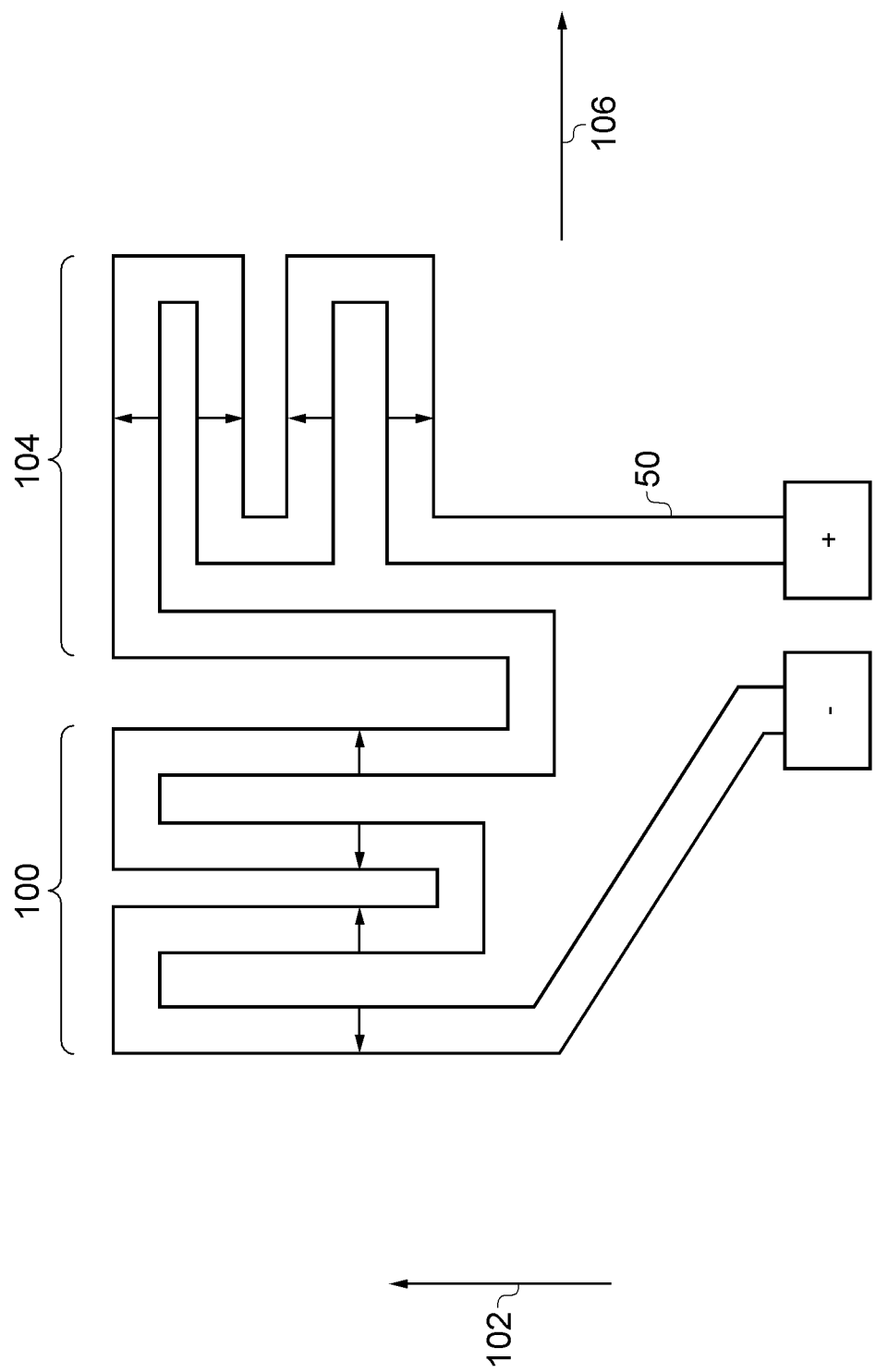
FIG. 10 is a diagram schematically illustrating the directions of perturbing magnetic fields at the magneto-resistors of FIG. 9.

FIG. 10 shows the directions of the perturbing magnetic fields when the conductor of the perturbation generator 50 is energized as shown, and buried beneath the magneto-resistors of FIG. 9.

Figure 11:
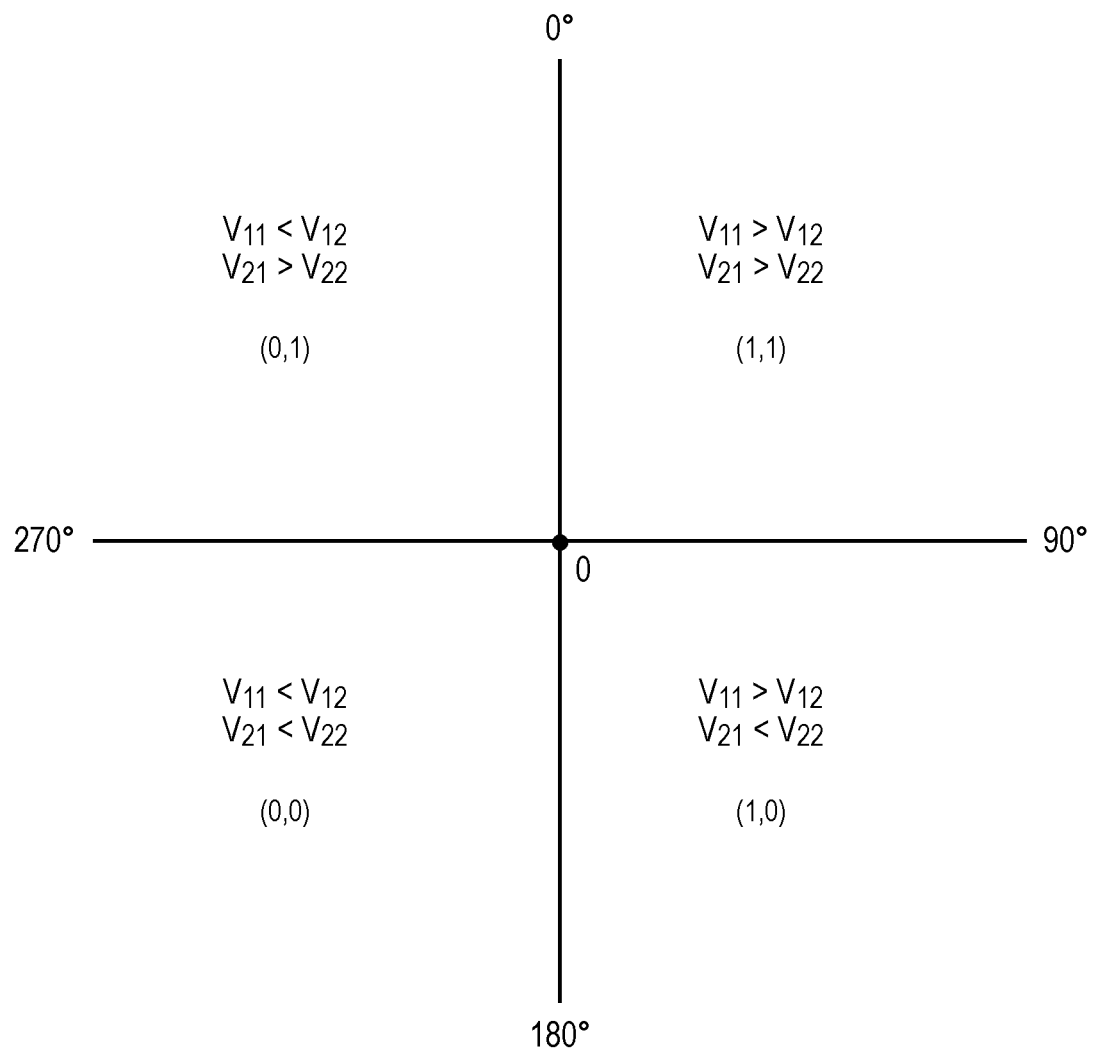
FIG. 11 is a diagram showing, for each quadrant that a magnetic field originates from, the output of the two direction detectors.

It becomes possible to map the relative magnitudes of $V_{11}$ and $V_{12}$, and $V_{21}$ and $V_{22}$ as the magnetic field is travelling left to right or right to left in the x-y plane illustrated in FIG. 11, where the detection axes 102 and 106 are illustrated so as to correspond with the direction shown in FIG. 10.

Thus for a field travelling from left to right the effect of the perturbation is to make $V_{11} > V_{12}$.

The second direction detector checks to see if the field is travelling upwardly or downwardly in the co-ordinate system shown in FIG. 11. If the field is travelling upwardly then $V_{21} > V_{22}$.

If the comparators are arranged such that $V_{11} > V_{12} = 1$, $V_{11} < V_{12} = 0$; $V_{21} > V_{22} = 1$ and $V_{21} < V_{22} = 0$, then the direction of the magnetic field can be represented as a two bit word, as also shown in FIG. 11.

Thus, in this example a magnetic field originating from the origin of travelling in to the 0° to 90° direction is represented by 1,1. In the 90° to 180° direction it is represented by 1,0 and so on. The signs of the comparator outputs can be changed by altering the input connections to $V_{11}$ and $V_{12}$, and to $V_{21}$ and $V_{22}$, and/or by reversing the polarity of the current flowing in the perturbation generator 50 (FIGS. 8, 9 and 10).

It is apparent that two quadrant detectors offset by 45° could be used to determine the direction of a magnetic field to within a sector constituting ⅛ of a circle. With a modification, a detector can also be sensitive to magnetic field directions perpendicular to the plane in which the magneto-resistors are formed. Such an arrangement is schematically illustrated in FIG. 12.

Figure 12:
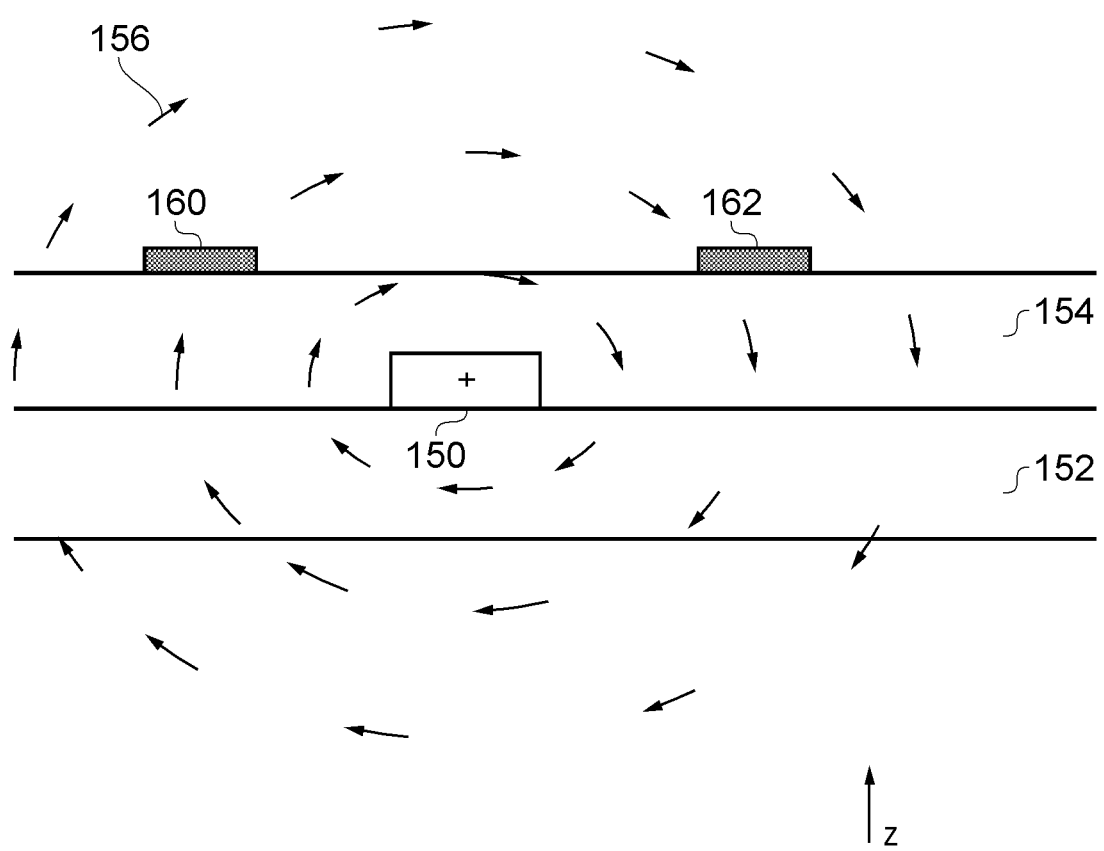
FIG. 12 is a cross section through a further embodiment, and illustrating the relative directions of a perturbing magnetic flux.

As shown in FIG. 12, a conductor 150 is formed over a substrate 152 and embedded within an insulator 154. First and second magneto-resistors 160 and 162 (corresponding to the magneto-resistors 12 and 14 of FIG. 1) are formed over the layer 154, and laterally displaced either side of the conductor 150.

The lines of magnetic flux 156 from current flow in the conductor 150 (conventional current flow direction into the plane of FIG. 12) are illustrated. The perturbing filed has an upward component at magneto-resistor 160 and a downward component at magneto-resistor 162. This allows sensing in the direction perpendicular to the plane of the integrated circuit carrying the magneto-resistors to occur. Such an arrangement may have to compete with shape anisotropy in the magneto-resistor resulting from the material being thin in the Z direction. As a result of this anisotropy, the sensitivity of this embodiment may be limited such that it needs the presence of a strong magnetic field and/or the magneto-resistors need to be formed with additional thickness in the Z direction.

Figure 13:
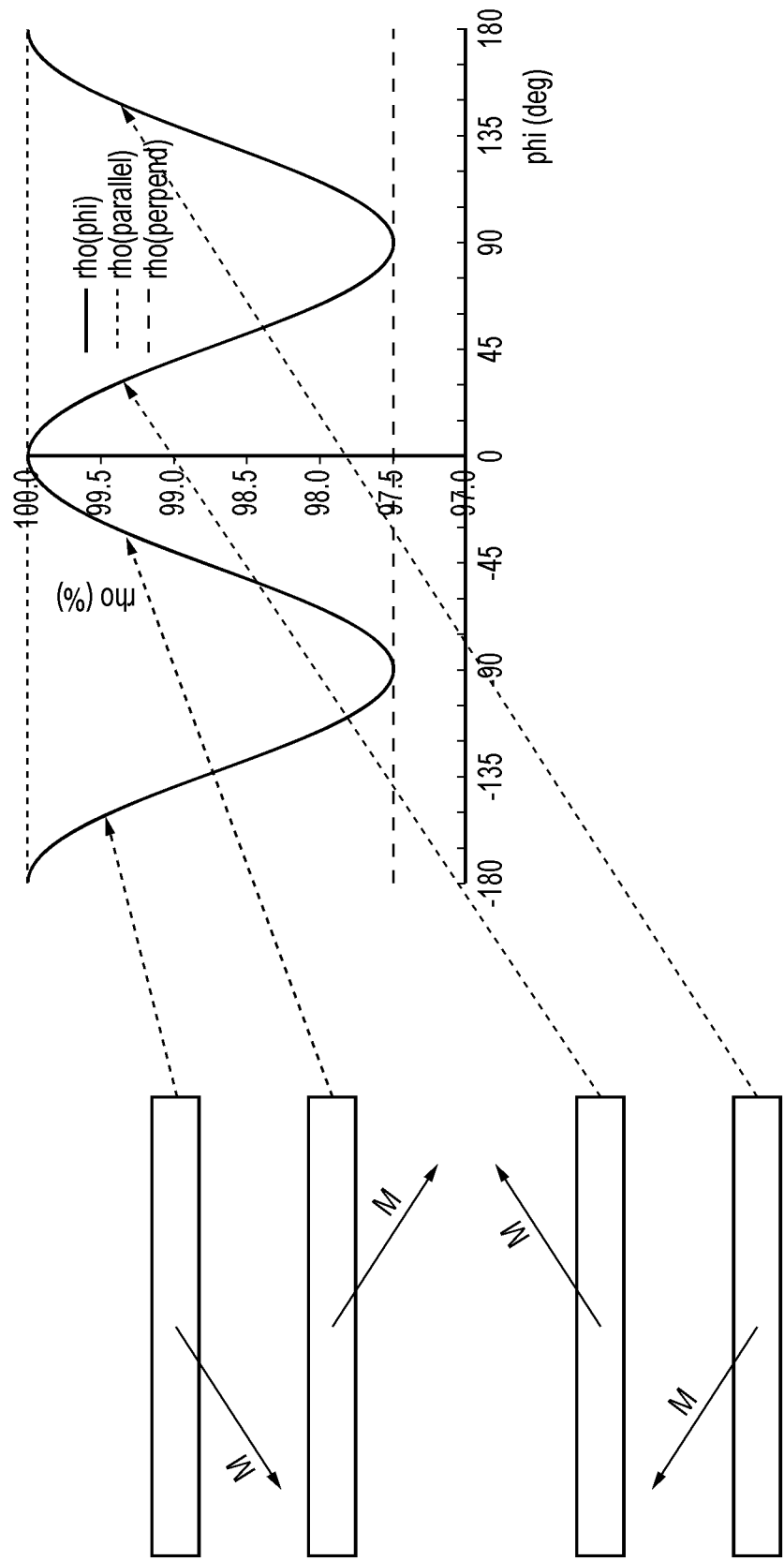
FIG. 13 is a diagram representing directional uncertainty at a magneto-resistive sensor in a magnetic angle direction detector.

The quadrant detector may be used to augment the output from the magnetic angle direction detectors using anisotropic magneto-resistance. Such sensors are also made from stripes of magneto-resistive material forming magneto-resistors, but do not have a perturbation generator. In order to understand the limitations of AMR elements as rotation detectors, for example when a bar magnet is carried on a shaft so as to measure the angular rotation of a shaft, consider FIG. 13, which represents the data of FIG. 6, but exemplifies that there are four directions of magnetic field direction M with respect to longitudinal axis of a magneto-resistor that give identical resistivities, and hence identical resistances.

Figure 14:
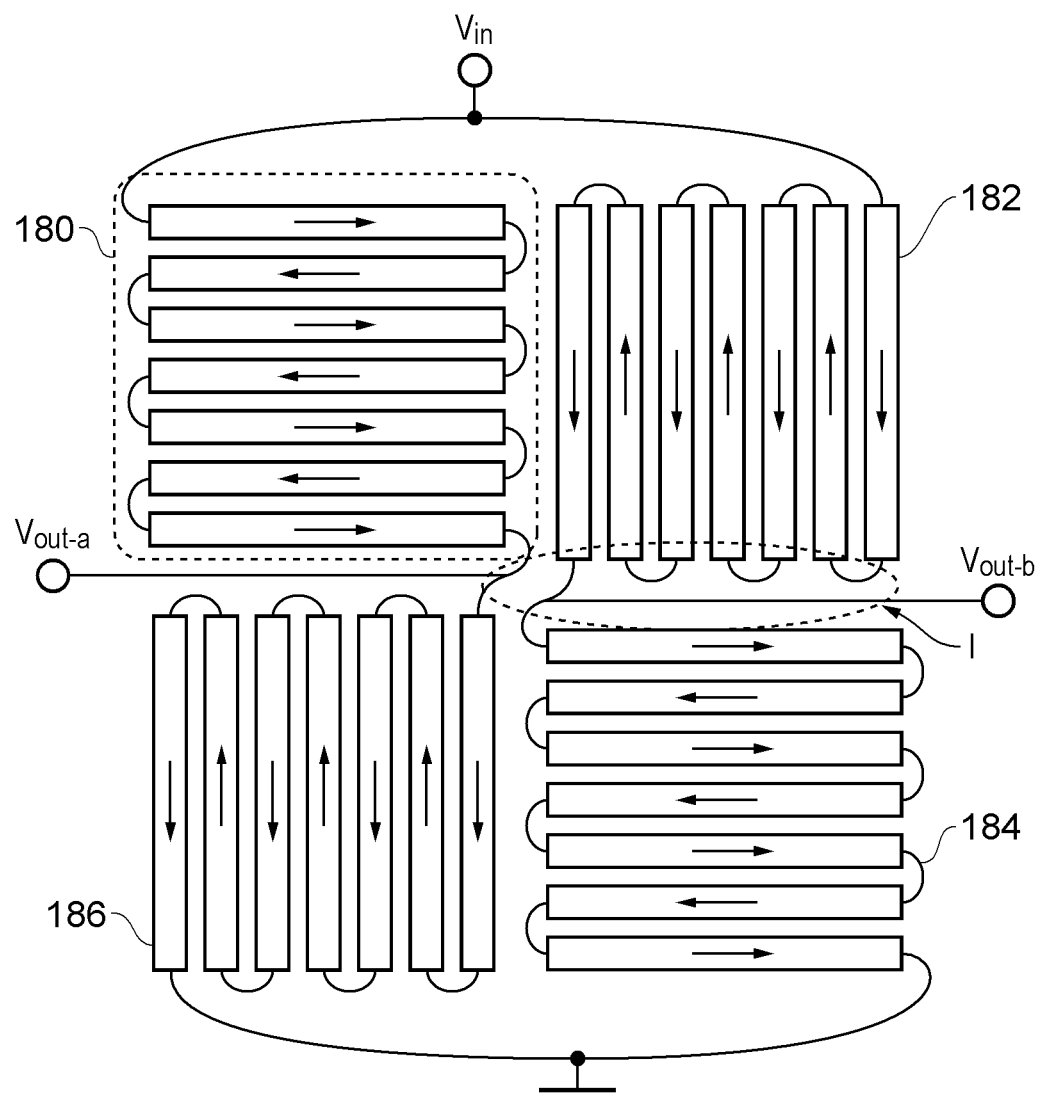
FIG. 14 schematically illustrates an anisotropic magneto-resistive bridge magnetic angle sensor.

This angular ambiguity remains unaltered when the magneto-resistors are placed into a bridge array of the type schematically illustrated in FIG. 14. Here magneto-resistive elements are laid parallel to one another in four blocks to form a bridge of resistors. Thus the seven magneto-resistive elements contained within the region 180 form a single magneto-resistor. The regions 182, 184 and 186 form other magneto-resistors which are then placed in a bridge configuration, such that the magneto-resistors 180 and 186 co-operate to form one limb of the bridge, and the magneto-resistors 182 and 184 co-operate to form the other limb of the bridge.

Figure 16:
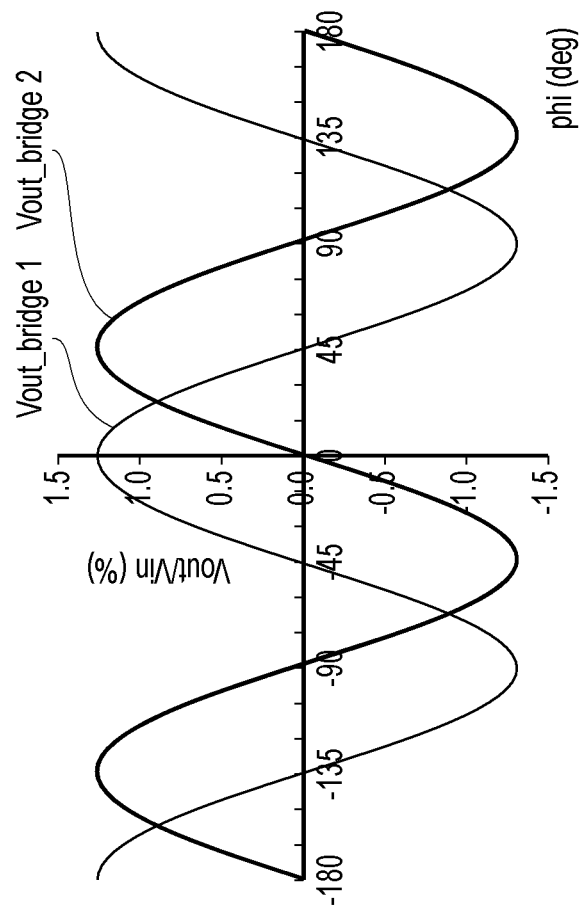
FIG. 16 is a graph representing output voltage versus angle across each bridge of a two bridge magnetic angle position sensor.
Figure 15:
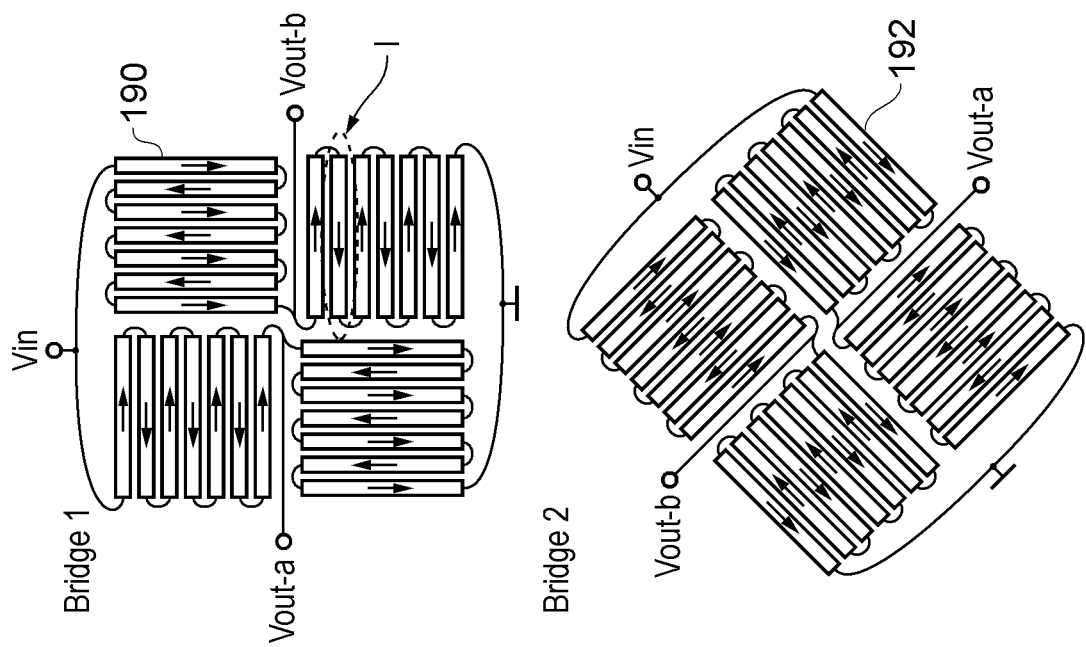
FIG. 15 schematically illustrates a two bridge magnetic angle position sensor.

In known angular position sensors it is known to form two magneto-resistive bridge configurations 190 and 192, with one bridge rotated by 45° with respect to the other bridge, as shown in FIG. 15. For each bridge an output signal Vout=Vout-a−Vout-b can be formed. These responses for the first bridge 190 and the second bridge 192 are illustrated in FIG. 16 as Vout_bridge1 and Vout_bridge2 respectively.

The output from the bridges can be combined as shown below in Eq. 1.

$$\text{Output angle} = 0.5 \arctan 2(V\text{out\_bridge1}, V\text{out\_bridge2}) \qquad \text{Eq. 1}$$

Figure 17:
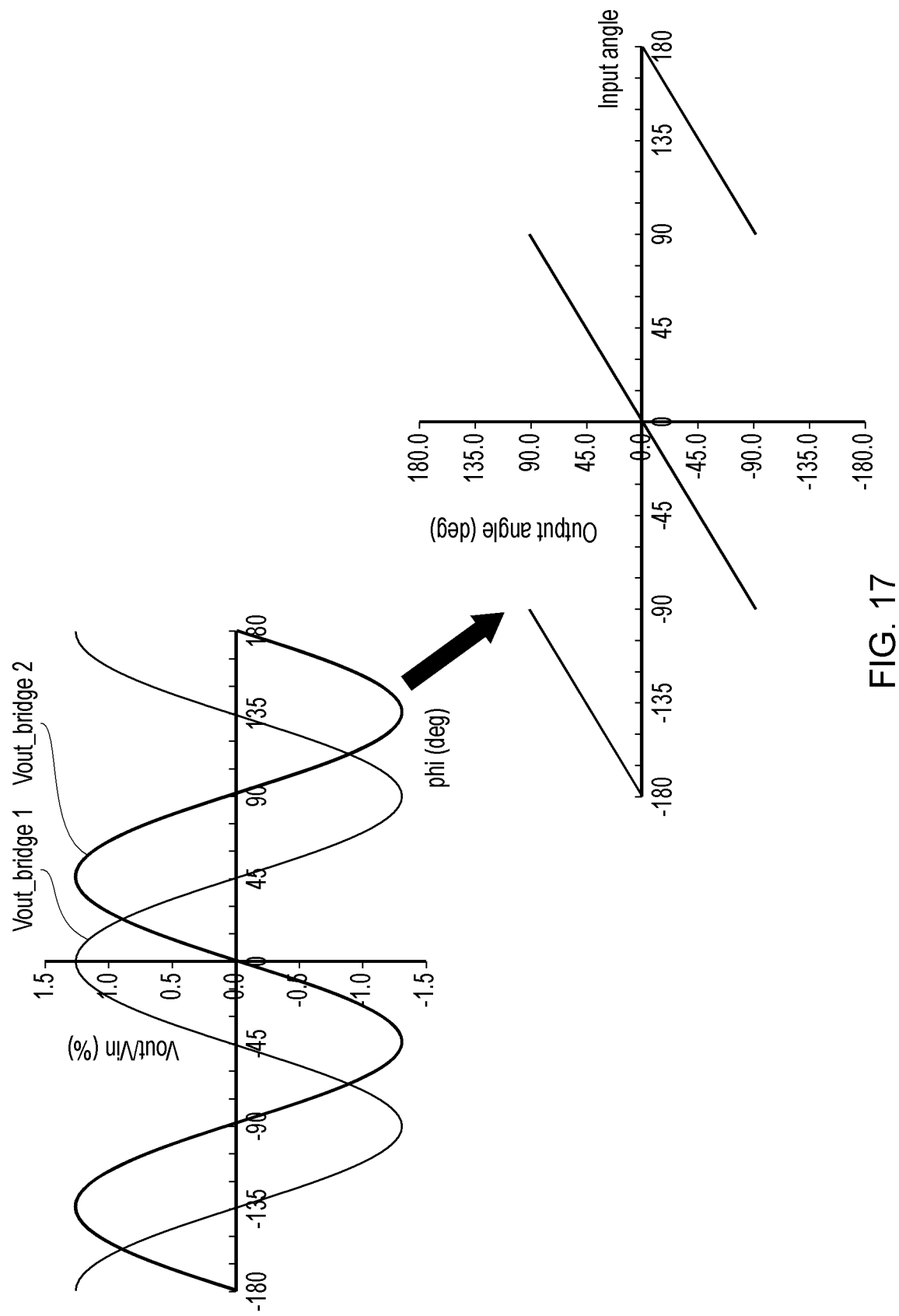
FIG. 17 is a graph showing the monotonic output of a two bridge magnetic angle sensor over a limited angular range after signal processing has taken place.

The output is shown in FIG. 17, and is monotonic in the range −90°<X<90° where X represents the direction of the magnetic field with respect to a sensing axis of the first bridge 190. So ambiguity still exists between, for example, −45° and +135°. However, by the inclusion of a quadrant detector as described herein, the angular uncertainty can be resolved and an unambiguous output given.

As noted before, the elements of the quadrant detector, or the individual direction detectors forming it, need not be straight or linear elements. Similarly the individual resistors of a detector need not be placed side by side, but may be disbursed over a substrate to achieve greater packing density. Similarly the conductor used to form the magnetic perturbation need not follow the paths disclosed hereinbefore and might, for example, be formed into a spiral path.

Figure 18:
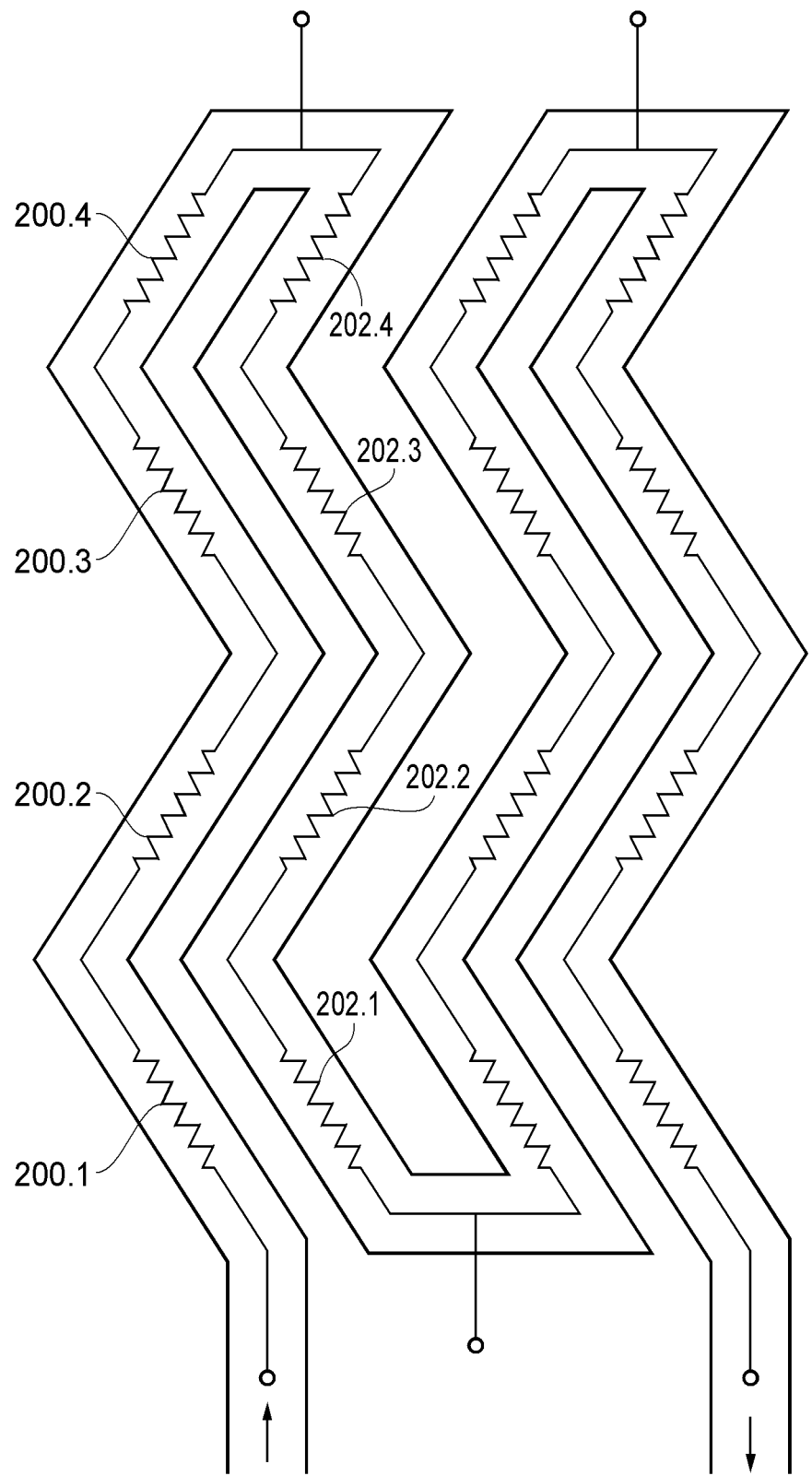
FIG. 18 is a schematic plan view of a further configuration of a perturbation generator.

FIG. 18 shows a modified magnetic field detector where each of the magneto-resistors is formed from a plurality of magneto-resistive elements formed above respective portions of the perturbation generator. This comparing FIG. 18 with FIG. 1, the first resistor 12 of FIG. 1 is now composed of four magneto-resistive elements 200.1 to 200.4. The magneto-resistive elements 200.1 to 200.4 are inclined with respect to one another so as to have a zig-zag pattern above a zig-zag perturbation generator. The other magneto-resistors are similarly formed.

The perturbation conductor need not be permanently energized. An angular position sensor should be able to keep a running estimate of angular position, so it should suffice to power up the quadrant detector, or indeed only a direction detector, at initialization, and/or periodically for checking purposes.

Figure 19:
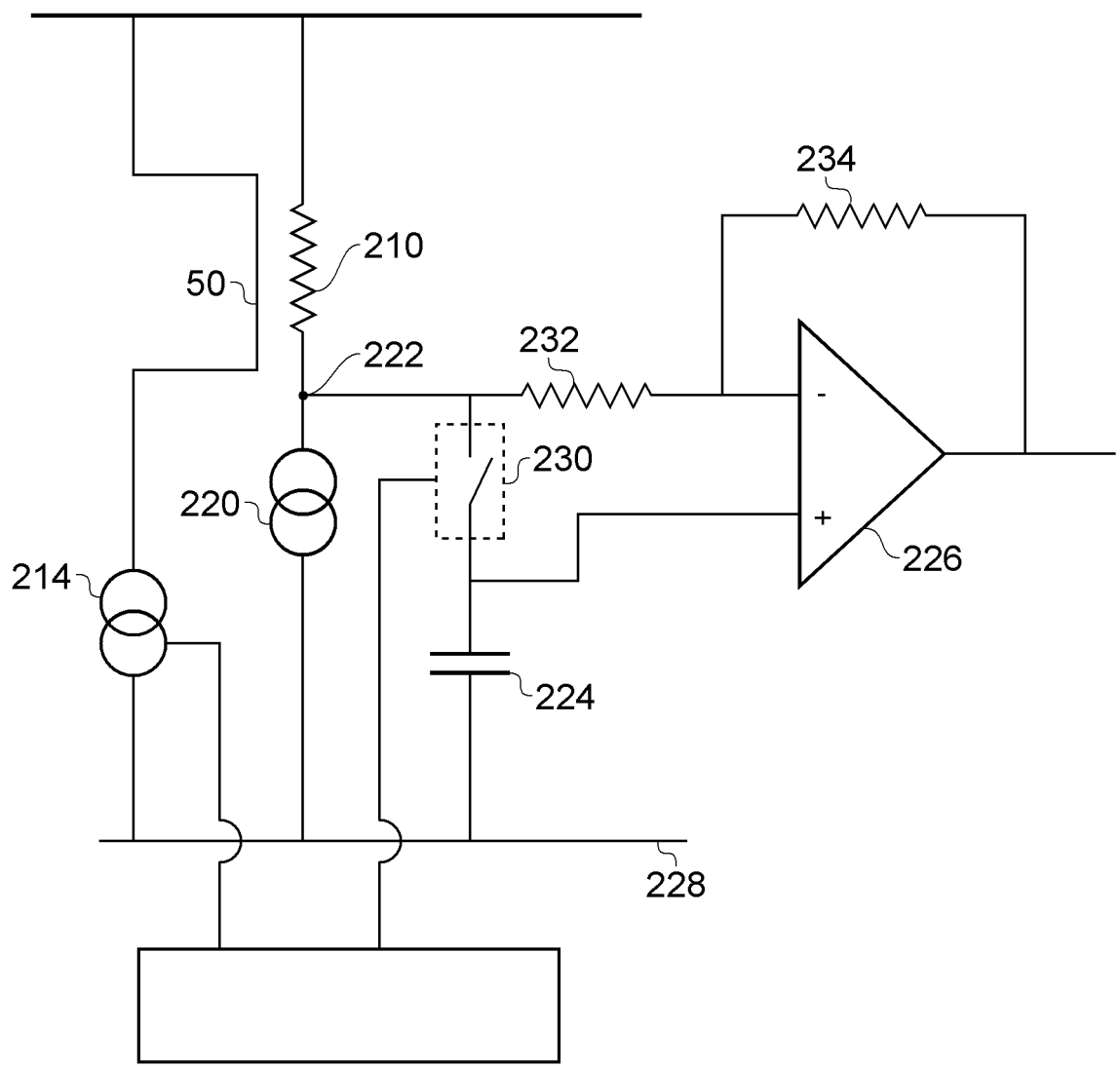
FIG. 19 is a circuit diagram for an embodiment of a magnetic field direction detector using a single magneto-resistor.

FIG. 19 shows a further embodiment where the number of magneto-resistors have been reduced, in this example, to a single resistor 210 placed next to a perturbation generator 50 which can be selectively energized by a controllable current sink 214 (or current source). The current through the magneto-resistor may also be controlled by a current sink 220 as shown, or by a current source. In the presence of a magnetic field having a component transverse to a sensing or detection direction of the resistor 210, energizing the perturbation generator causes the resistance of the resistor 210 to either decrease or increase, depending on the direction of the magnetic field. This causes the voltage at node 222 to change. If this change can be monitored, then the direction of the magnetic field can be estimated. FIG. 19 shows a circuit capable of monitoring the change in voltage at node 222. A capacitor 224 has a first terminal connected to a non-inverting input of an operational amplifier 226. A second terminal of the capacitor is connected to a local ground or to a supply rail 228. An electrically controlled switch 230, for example formed by a FET, is provided to connect the first terminal of the capacitor 224 to node 222. The inverting input of the amplifier 226 is connected to the node 222 by a resistor, and also to the output of the amplifier 226 by resistor 234. These resistors act to define the gain of the amplifier 226.

When switch 230 is closed, the capacitor can charge to the voltage of node 222. During this time the current sink 214 may be de-energized so that no current flows in the perturbation generator 50. When it is desired to check the direction of the magnetic field, the switch 230 is opened such that the voltage at node 222 is held on the capacitor 224. The perturbation generator is then energized, causing the resistance of the resistor 210 to change, and hence the voltage at node 222 to change. This new voltage is provided to the inverting input where it is compared with the immediately preceding value by the amplifier 226, and the sign of the amplifier output is indicative of the direction of the magnetic field. The amplifier 226 may be replaced by a comparator and resistors 232 and 234 dispensed with, and the inverting input of the comparator connected directly to node 222.

The direction detector is suitable for integration within an integrated circuit containing angular position sensors, and in some circumstances the same AMR bridge may be used to form part of an angular direction detector and the direction detector, i.e. semi-sphere or quadrant detector of the present disclosure.

An apparatus and method for magnetic field detection including a magnetoresistive sensor and a conductor or perturbation generator allowing resolving direction uncertainty of an external magnetic field are disclosed in U.S. application Ser. No. 13/655,059 ("'059 Application") titled "MAGNETIC FIELD DIRECTION DETECTOR," the entirely of which is hereby incorporated by reference. As disclosed in the '059 Application, magnetoresistive sensors can have an accompanying perturbation generator in an isolated layer below or above the layer including magnetoresistive sensors, and the perturbation generator can be configured to conduct currents in different directions near different stripes of the magnetoresistive sensors. The perturbation generator implemented as disclosed in the '059 Application allows determination of which quadrant the direction or angle of an external magnetic field is in based on comparing the output values of the different stripes perturbed by the conductor. As also discussed in the '059 Application, the direction detector having the perturbation generator can be implemented with magnetoresistive sensors formed in a bridge configuration. In such examples, a first set of magnetoresistive stripes are provided in one direction, having a first detection axis, and a second set of magnetoresistive stripes are provided in another direction, having a second detection axis, where the first and second directions can be approximately perpendicular to each other. The first and second sets of magnetoresistive stripes can be referred to as sine bridge resistors and cosine bridge resistors, respectively.

Magnetic sensors, such as anisotropic magnetoresistive (AMR) sensors, giant magnetoresistive (GMR), tunneling magnetoresistive sensors (TMR), or any other magnetoresistive (XMR) sensors, each provide different advantages in implementing a magnetic field detector. And applications implemented using different types of magnetic sensors may be able to sense different ranges of angles of an external field. For example, some applications of AMR sensors formed in a bridge may only be able to determine the angle of an external magnetic field in the range of 0 to 180 degrees as the outputs from the AMR sensor bridges may repeat every 180 degrees. Certain magnetic field detectors can allow a full 360 degree range of external field angle detection with a relatively wide magnetic window and relatively high accuracy. This can allow the sensors to benefit from advantages of certain magnetoresistive sensors, such as AMR sensors, while overcoming certain disadvantages associated with those sensors.

An AMR quadrant detector can supplement to AMR angular position sensor and expand its range from 180 degrees to a full 360 degree rotation. Some AMR angular sensors provide an output signal corresponding to an angle of an external field with 2× increased phase, so that for a 360 degree magnetic field rotation, 2 periods (720 degrees) of an output signal are provided. It can therefore be challenging to distinguish, whether the actual measured angle is $\alpha$ or $\alpha+180$ degrees.

A number of applications can benefit from an ability to resolve this ambiguity. A solution disclosed in the '059 Application involves adding 2 specifically designed AMR bridges (AMR Quadrant Detector) which can have zero output in normal operation, but upon biasing with an overlaid "coil," which can as also be known as a perturbation generator or bias conductor, would provide direction of measured field within a quadrant. It will be understood that the "coil" can have shapes other than coils and can generally be adjacent the magnetoresistive elements. This additional information combined with an AMR angular sensor provides a full 360 degree operation range. The quadrant detector can be based on substantially the same process as the angular AMR bridges, and can be implemented with only 1 additional metallic layer in certain embodiments. Accordingly, integration within a single die is possible.

By tilting the resistive stripe angles within the quadrant detector from the '059 Application (see FIG. 9, herein), it is possible to avoid singular-point ambiguity without resorting to having to use both a quadrant detector and an angle detector. It is also shown that in one embodiment of resistive stripes, a sinewave output with a 360 degree period can be obtained. Furthermore, by changing the polarity of a biasing current, the bridge offset (and its drift) can be detected, reduced, and/or removed through signal processing. Further, a relatively large field magnitude of an applied magnetic field can be measured by this arrangement in addition to the angular direction of the applied magnetic field. This can have significant functional safety feature uses.

One advantage of this proposed solution compared to various co-packaged combinations of sensors of different technologies is that embodiments disclosed herein can use the same process as one type of magnetic sensor (e.g., AMR sensor). Accordingly, integration on the same die is possible with an additional metallic layer. Additionally, if the magnetic sensor (e.g., AMR) is monolithically integrated onto an ASIC, the number of dies in package drops to one compared to at least three in some other approaches. In some implementations, the biasing current can be turned off most of the time, when no quadrant information is desired in order to save power, and turned on only in given intervals or on demand.

This disclosure provides magnetic field sensors arranged to sense a magnetic field and/or a differential magnetic field. The principles and advantages of these magnetic field sensors can be applied to generate a contactless current measurement.

The magnetic field sensors can include magnetoresistive sensing elements to measure a magnetic field and/or a differential magnetic field for current measurement. A significant drawback of some previous magnetic field and/or differential magnetic field measurements using magnetoresistive sensors is error due to offsets, such as offset temperature compensation and/or long term offset drift. Such offsets can limit accuracy in a range of about 1% to 2% in certain instances. This can be unfortunate because magnetoresistive sensors can have a relatively high resolution (e.g., a dynamic range of about 130 dB).

Some previous efforts to reduce sensor offset involved using the flipping principle. However, sensors that use the flipping principle have involved relatively high current pulses to flip the sensitivity and relatively weak repeatability after flipping.

Aspects of this disclosure relate to magnetic field sensors that can reduce and/or eliminate sensor offset of magnetoresistive sensors to enable them to use a wider dynamic range. Any suitable principles and advantages discussed above with reference to a magnetic field direction sensor and/or a perturbation generator can be applied in connection with the magnetic field sensors and/or the differential magnetic field sensors discussed herein. The magnetic field sensors discussed herein can be used for magnetometer applications and/or compassing. The differential magnetic field sensors discussed herein can be used for current measurement applications. Other applications for the magnetic field sensors discussed herein include current measurement in solar panels, direct current to alternating current power transfer applications, laser powering, and battery management, among others.

Figure 20:
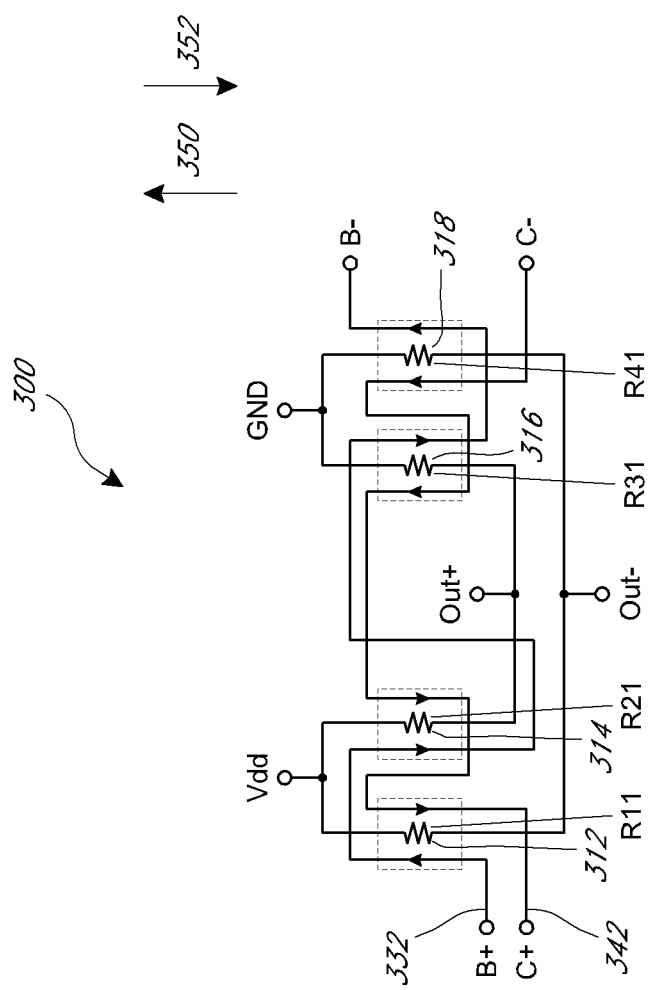
FIG. 20 is a schematic diagram of an embodiment of a magnetic field sensor.

FIG. 20 is a schematic diagram of an embodiment of a magnetic field sensor 300. The magnetic field sensor 300 comprises first to fourth magnetoresistive elements 312, 314, 316, and 318 having respective resistances R11 to R41. The magnetoresistive elements 312, 314, 316 and 318 are configured as a Wheatstone bridge. The magnetic field sensor 300 can include two or more conductors near the magnetoresistive elements 312, 314, 316, and 318. For example, the conductors can be positioned adjacent to the first to fourth magnetoresistive elements 312, 314, 316, and 318. In some embodiments where there are two conductors as illustrated in FIG. 20, a first conductor can be a bias structure carrying a bias current and a second conductor compensation structure carrying a compensation current. As illustrated, the magnetic field sensor includes a biasing conductor 332 configured to carry a bias current and a compensation conductor 342 configured to carry a compensation current. In certain embodiments, the biasing conductor 332 and the compensation conductor 342 can be disposed in layers on opposing sides of the magnetoresistive elements 312, 314, 316, and 318 The biasing conductor 332 has a first biasing node B+ and a second biasing node B−. The compensation conductor 342 has a first compensation node C+ and a second compensation node C−.

The first to fourth magnetoresistive elements 312, 314, 316, and 318 are magnetoresistive (xMR) elements. For instance, the first to fourth magnetoresistive elements 312, 314, 316, and 318 can be anisotropic magnetoresistance (AMR) elements. Such AMR elements can include resistor stripes without barber poles.

The biasing conductor 332 is arranged to generate a biasing magnetic field perpendicular to the xMR resistor length due to a current flow. The biasing conductor 332 is arranged to generate a reverse field sensitivity for magnetoresistive elements 312 and 316 relative to magnetoresistive elements 314 and 318. The biasing conductor 332 can be implemented in a variety of ways. For example, the biasing conductor 332 can be implemented by conductive metal in a single layer or in multiple layers. Fewer layers can have the advantage of lower cost. Conductors in series with each other in multiple layers can offer power savings as the same current can be passed through multiple layers and generate a higher magnetic field for a given amount of current. For example, these layers can be above and/or below the layer of the magnetoresistive elements 312, 314, 316, and 318. In one example, the biasing conductor 332 is implemented in a layer above and a layer below the magnetoresistive elements 312, 314, 316, and 318. In another example, the biasing conductor 332 is implemented in two layers above and two layers below the magneto-resistive elements 312, 314, 316, and 318. Other variations can be implemented. Other ways of providing a perturbing magnetic field are applicable. For example, rather than generating a magnetic field via electrical current, a permanent magnet can alternatively be used.

The compensation conductor 342 can provide filed compensation for linearization. The compensation conductor 342 can generate a magnetic field that is opposite of an external magnetic field which would bring the output of the Wheatstone bridge to approximately zero. The current in the compensation conductor 342 can be a measurement of the external magnetic field. For instance, the compensation current can be based on an output of the Wheatstone bridge that includes the magnetoresistive elements 312, 314, 316, and 318. Similar to the biasing conductor 332, the compensation conductor 342 can be implemented in a single layer or in multiple layers.

A current flow direction in the bias conductor 332 and the compensation conductor 342 can be significant in the magnetic field sensor 300 to ensure proper operation. In the embodiment shown in FIG. 20, the biasing conductor 332 is arranged so that the current in the biasing conductor 332 adjacent to the first magnetoresistive element 312 and the fourth magnetoresistive element 318 flows in a upward direction 350 for a particular time frame, the current in the biasing conductor 332 adjacent to the second magnetoresistive element 314 and the third magnetoresistive element 316 flows in a downward direction 352 for the particular time frame. The current in the compensation conductor 342 adjacent to the first and second magnetoresistive elements 312 and 314, respectively, flows in a downward direction 352. The current in the compensation conductor 342 adjacent to the third and fourth magnetoresistive elements 316 and 318, respectively, flows in an upward direction 350.

Therefore, in the illustrated embodiment of FIG. 20, the biasing conductor 332 and the compensation conductor 342 would have current flowing in the same direction near the second and the fourth magnetoresistive elements 314 and 318 and in the opposite direction near the first and third magnetoresistive elements 312 and 316. In other words, in a first half bridge, defined by the first and fourth magnetoresistive elements 312 and 318 in the Wheatstone bridge, the current flow direction in the bias conductor 332 is opposite of the current flow direction in the compensation conductor 342 adjacent to the first magnetoresistive element 312, and the current flow direction in the bias conductor 332 is the same as the current flow direction in the compensation conductor 342 adjacent to the fourth magnetoresistive element 318. Further, in a second half bridge, defined by the second and the third magnetoresistive elements 314 and 316, the current flow direction in the bias conductor 332 is opposite of the current flow direction in the compensation conductor 342 adjacent to the third magnetoresistive element 316, and the current flow direction in the bias conductor 332 is the same as the current flow direction in the compensation conductor 342 adjacent to the second magnetoresistive element 314.

The direction of the current in the biasing conductor 332 can be flipped at regular intervals of time. For example, the bias current can behave as shown in FIG. 30B. Similarly, the direction of the compensation current in the compensation conductor 342 can be flipped at approximately the same times as the bias current. The compensation current can be based on the output of a half bridge and/or a full bridge.

The embodiment of FIG. 20 allows for making the offset of an output Out+ and/or Out− to be approximately zero. For example, the illustrated biasing can increase resistance of magnetoresistive elements 312 and 318 in an external field while decreasing resistance of magnetoresistive elements 314 and 316. Also, as explained above, the compensation conductor 342 can generate a magnetic field that is opposite an external magnetic field. Thus, the magnetic field at the first and fourth elements 312 and 318 can be brought to approximately zero.

The same effect can also occur in the second half bridge comprising the second and third magnetoresistive elements 314 and 316.

Magnetic field sensors include sensors configured to detect a magnetic field and/or a differential magnetic field. Magnetic field sensors configured to detect a differential magnetic field can be referred to as differential magnetic field sensors.

Figure 21:
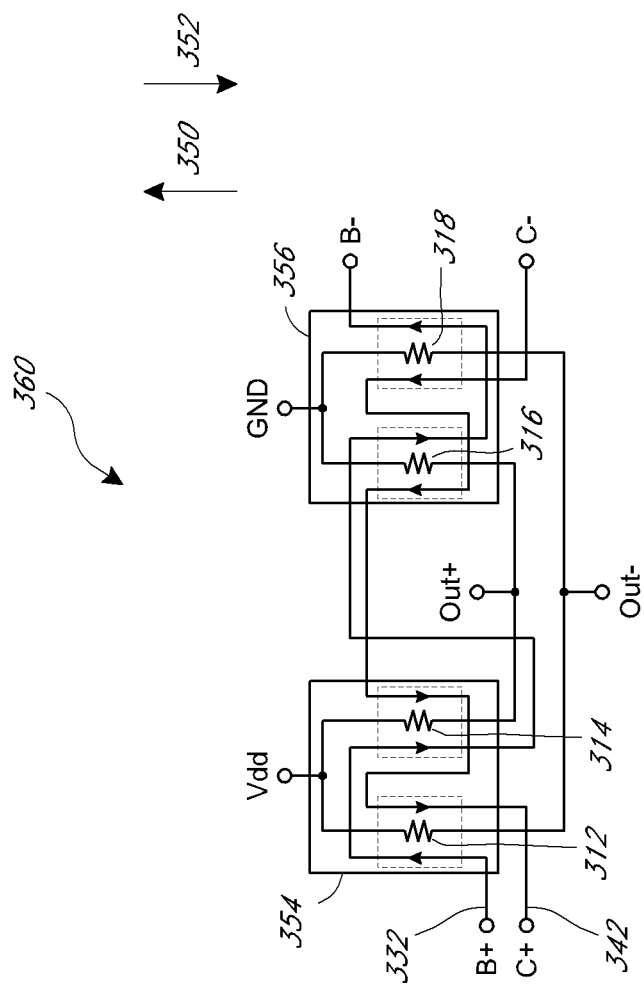
FIG. 21 is a schematic diagram of an embodiment of a differential magnetic field sensor.

FIG. 21 illustrates an embodiment of a differential magnetic field sensor 360. The differential field sensor 360 in FIG. 21 is generally similar to the magnetic field sensor 300 illustrated in FIG. 20 except the first and second magnetoresistive elements 312 and 314 are physically distanced from the third and fourth magnetoresistive elements 316 and 318 in the differential field sensor 360 (e.g., positioned in two different portions of a chip). As illustrated, the first and second magnetoresistive elements 312 and 314 are disposed in a first area 354 and the third and fourth magnetoresistive elements 316 and 318 are disposed in a second area 356. In this embodiment, when two same magnetic fields are applied to a first area 354 having the first and second magnetoresistive elements 312 and 314 and a second area 356 having the third and fourth magnetoresistive elements 316 and 318, there is no measurable field difference at the first area 354 and the second area 356. However, with different magnetic fields, there can be a measurable change in the output signal. This mechanism can be used in a differential field measurement to reduce and/or eliminate any homogeneous field. Hence, a differential field generated can be measured more precisely than measurement without this mechanism.

The current flow direction in the differential magnetic field sensor 360 is different from the current flow direction of the magnetic field sensor 300 illustrated in FIG. 20. However, current flow in biasing conductor 332 and the compensation conductor 342 is in the same direction adjacent to the second and the fourth magnetoresistive elements 314 and 318 and in the opposite direction adjacent to the first and third magnetoresistive elements 312 and 316.

Figure 22:
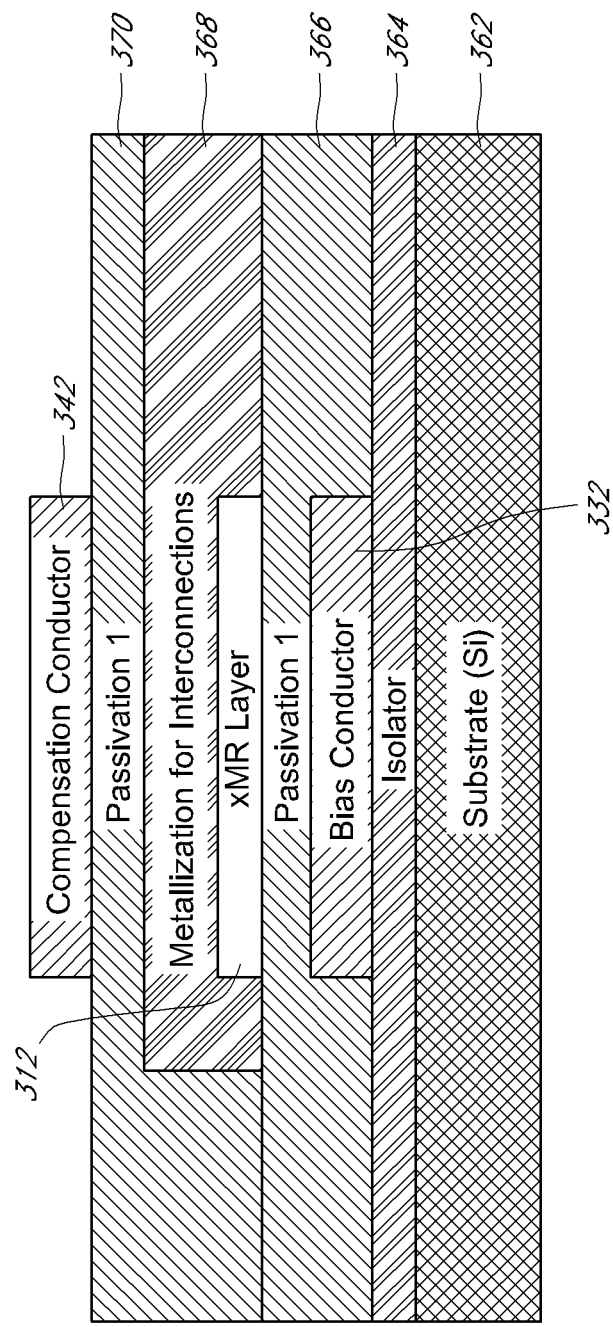
FIG. 22 is a cross sectional view of a magnetic field sensor according to an embodiment.

FIG. 22 is a cross sectional view of a magnetic field sensor. FIGS. 23-26 are schematic plan views showing different layers of the magnetic field sensor during various stages of manufacture. The magnetic field sensor shown in FIG. 22 includes an isolation layer 364, a bias conductor 332, two passivation layers 366 and 370, a magnetoresistive element 312, a metallization layer 368, and a compensation conductor 342, on a semiconductor substrate 362. In some embodiments, it can be beneficial to have the magnetoresistive element 312 between the bias conductor 332 and the compensation conductor 342. Such arrangement can provide the magnetoresistive element 312 with a maximum magnetic field. However, in some embodiments, different layer configurations can be made. For example, the bias conductor 332 and the compensation conductor 342 can be positioned on the same plane and/or stacked together on one side of the magnetoresistive element 312. Also, it should be appreciated that different shapes of the conductors 332 and/or 342 can be arranged to generate different magnetic field directions.

Figure 24:
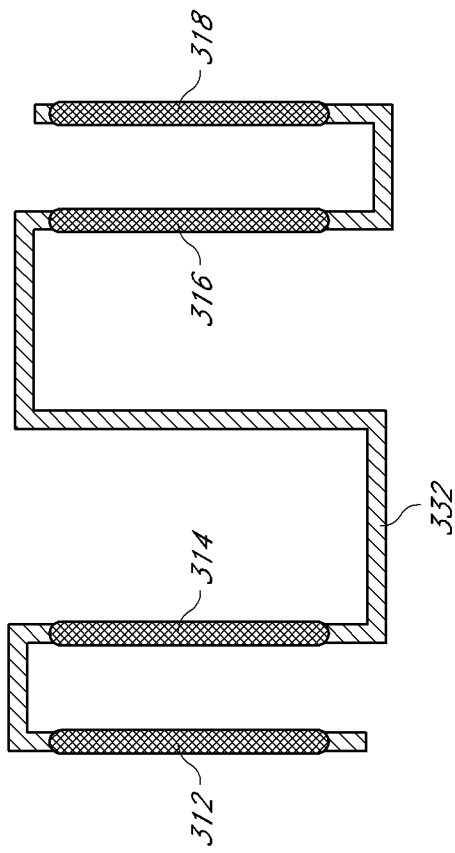
FIG. 24 illustrates magnetoresistive elements formed over a biasing conductor.
Figure 23:
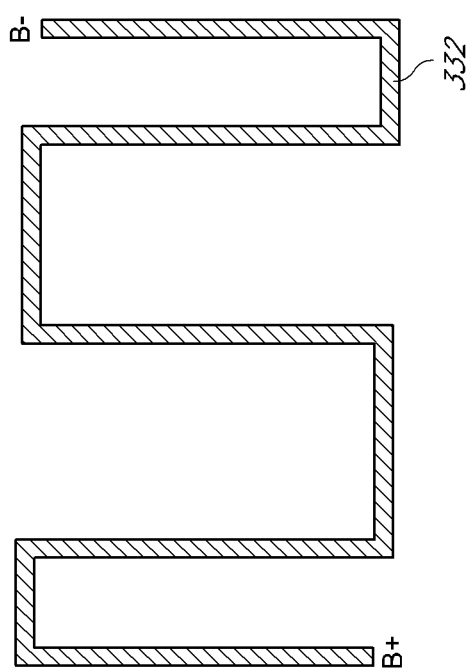
FIG. 23 illustrates a biasing conductor of the magnetic sensor of FIG. 22 during a stage of manufacturing.
Figure 26:
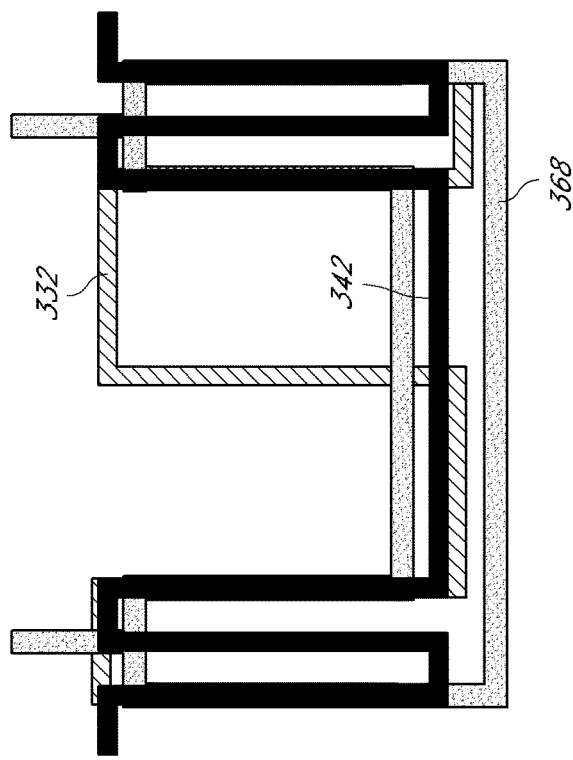
FIG. 26 illustrates a compensation conductor formed over portions of the biasing conductor, the magnetoresistive elements, and the metallization layer.
Figure 25:
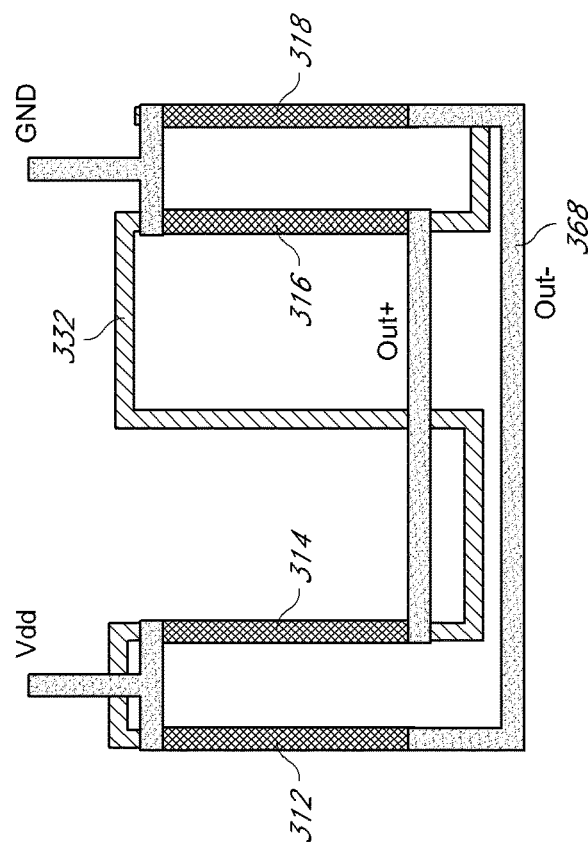
FIG. 25 illustrates a metallization layer connecting the magnetoresistive elements formed over the biasing conductor.

An example method of manufacturing a magnetic field sensor will be described with reference to FIGS. 23-26. This method can form a magnetic field sensor on a semiconductor substrate (e.g., a silicon substrate) and/or on an isolator over the semiconductor substrate. As shown in FIG. 23 a biasing conductor 332 can be formed. Then magnetoresistive elements 312, 314, 316, and 318 can be formed over the biasing conductor 332 as shown in FIG. 24. As shown in FIG. 22, a passivation layer 364 can be disposed between the biasing conductor 332 and the magnetoresistive elements 312, 314, 316, and 318. Interconnects, e.g., the metallization layer 368, can be formed to electrically connect the magnetoresistive elements 312, 314, 316, and 318 as shown in FIG. 25. A compensation conductor 342 can be formed over the magnetoresistive elements 312, 314, 316, and 318 as shown in FIG. 26. FIG. 22 illustrates that a passivation layer 370 can be disposed between the magnetoresistive elements 312, 314, 316, and 318 and the compensation conductor 342.

Figure 27:
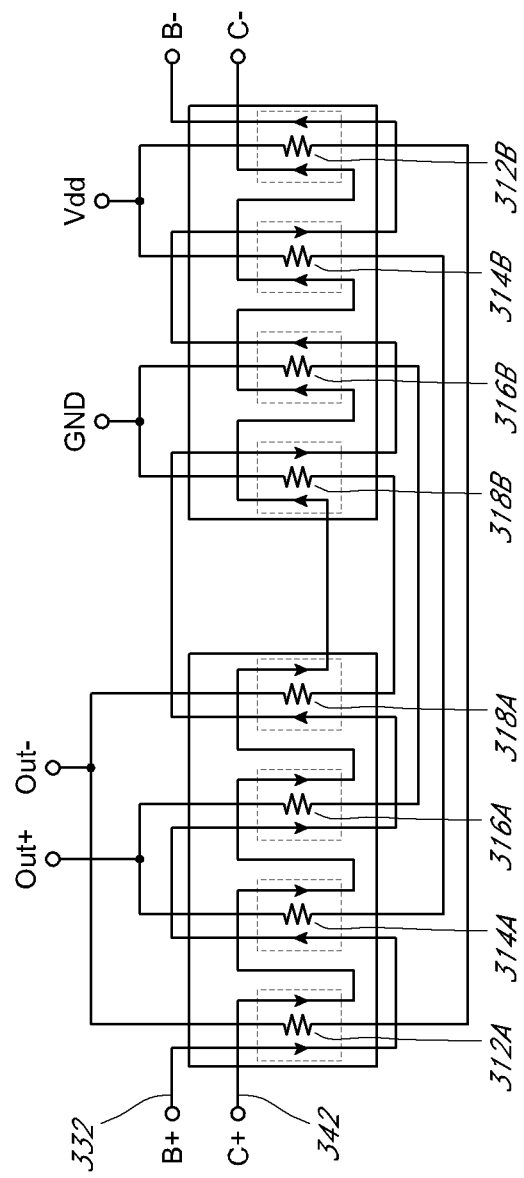
FIG. 27 is a schematic diagram of a differential magnetic field sensor according to an embodiment.
Figure 28:
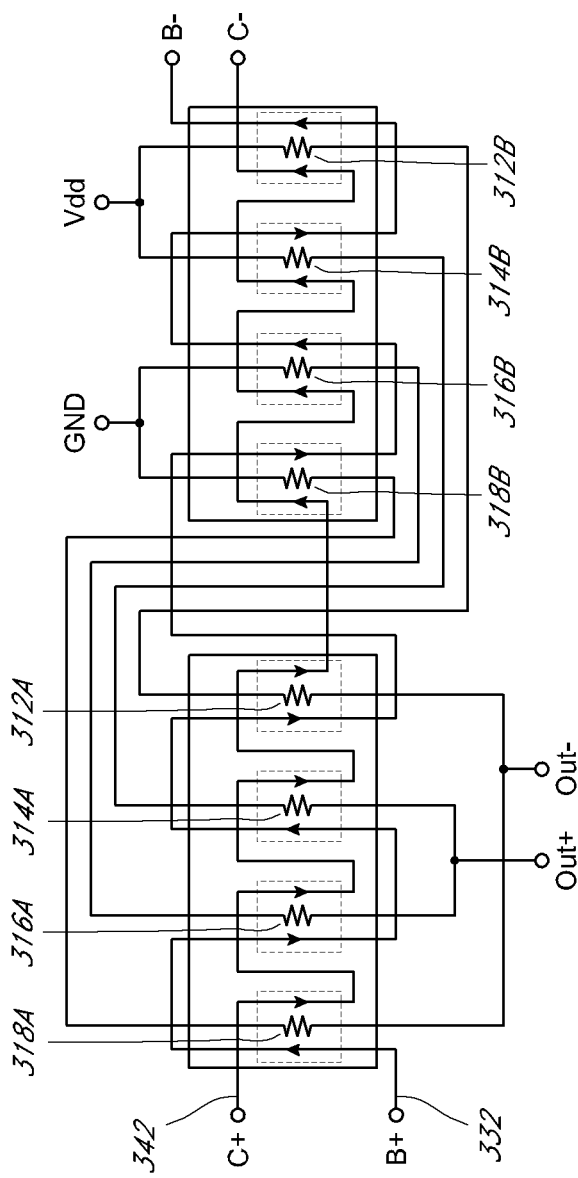
FIG. 28 is a schematic diagram of a differential magnetic field sensor according to another embodiment.

FIGS. 27 and 28 show different embodiments of a differential magnetic field sensor. In these embodiments, each magnetoresistive element of a Wheatstone bridge is implemented by two separated magnetoresistive portions on different sides of the differential magnetic field sensor. The differential magnetic field sensors of FIGS. 27 and 28 each includes a sub-magnetoresistive element of each magnetoresistive element of a full bridge on different sides of the differential sensor. Sub-magnetoresistive elements 312A, 314A, 316A, and 318A are in a first portion of the sensor and sub-magnetoresistive elements 312B, 314B, 316B, and 318B and in a second portion of the sensor that is spaced apart from the first portion. By having two pairs of sub-magnetoresistive elements in separate portions in the differential magnetic field sensor, each magnetoresistive element of a half bridge can be matched on an opposing side of the differential magnetic sensor. Different parts of a substrate can have different temperatures. Unwanted temperature gradients on the substrate can alternatively or additionally be generated by external mechanisms. The differential magnetic field sensors of FIGS. 27 and 28 can improve matching of magnetoresistive sensing elements in terms of temperature drift.

Figure 29:
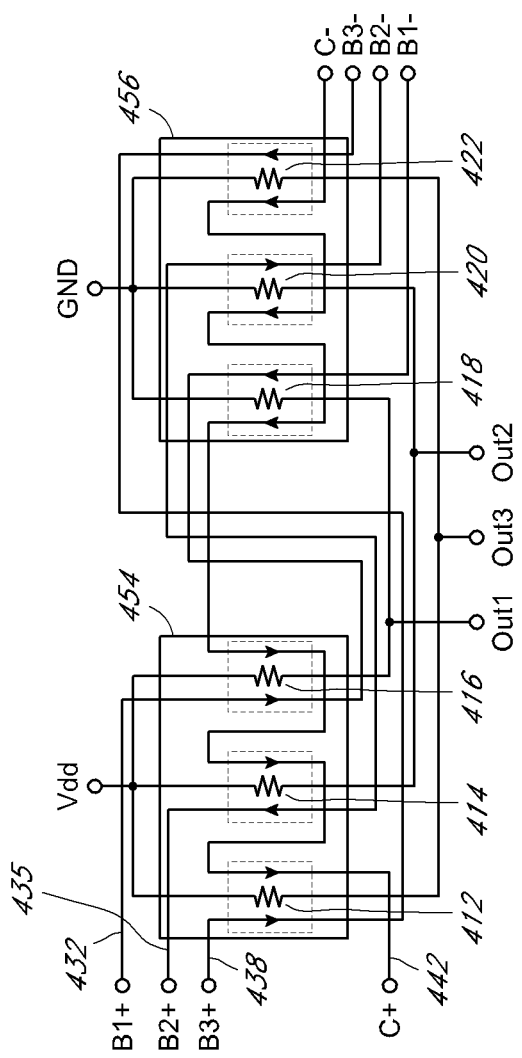
FIG. 29 is a schematic diagram of a differential magnetic field sensor with three half bridges and three outputs according to an embodiment.

Since a magnetic field sensor may only generate an output signal when a bias current is applied and the sensitivity direction is dependent on the applied current direction, an offset compensation can be implemented. In some applications, it can be beneficial to have one signal path operating while another signal path is being calibrated. A sensor architecture with three outputs as shown in FIG. 29 implements such features. For instance, a first output and a second output of the sensor can be used for sensing a differential magnetic field while a third output is being calibrated to approximately zero and has the same sensitivity as the second output. Currents through the different bias conductors can control such operation of the sensor.

In FIG. 29, a differential magnetic field sensor having three half bridges with three outputs Out1, Out2, and Out3 is shown. This differential magnetic field sensor includes three half bridge, a first to third biasing conductors 432, 435, 438, and a compensation conductor 442. The three half bridges comprise first to third half bridges. The first half bridge comprises magnetoresistive elements 416 and 418, the second half-bridge comprises magnetoresistive elements 414 and 420, and the third half-bridge comprises magnetoresistive elements 412 and 422. Although a differential magnetic field sensor is described with reference to FIG. 29, the principles and advantages of this embodiment can be applied to other magnetic field sensors that sense a non-differential magnetic field.

In some embodiments, when an internal magnetization of each of the magnetoresistive elements 412, 414, 416, 418, 420, and 422 is periodically flipped at regular intervals, a differential measurement of a single component of the external magnetic field can be performed. Thus, flipping the bias current between positive and negative can reduce and/or eliminate the offset. When the flipping takes place in the differential magnetic field sensor, there is typically a time lag for calibration and the measurement can be discontinued during such calibration. However, using three or more half bridges, continuous measurement can be achieved. For example, referring to FIG. 29, when measuring the current between a first output Out1 and a second output Out2 and generating biasing current flowing in one direction for the first output Out1 and in the opposite direction for the second output Out2, a third output Out3 may have biasing current in the same direction as biasing current for the first output Out1. In this case, there is an offset between the first output Out1 and the third output Out3 and there can be approximately zero offset between the first output Out1 and the second output Out2. Then, the biasing current for the third output Out3 can be flipped and the current can be measured between the first output Out1 and the third output Out3 while the second output Out2 is being calibrated. Thus, a continuous measurement can be done even while the biasing current is being flipped in one of the biasing conductors 432, 435 and 438. FIGS. 30A-32C provide more details regarding how this sequence can be implemented.

Figure 30A:
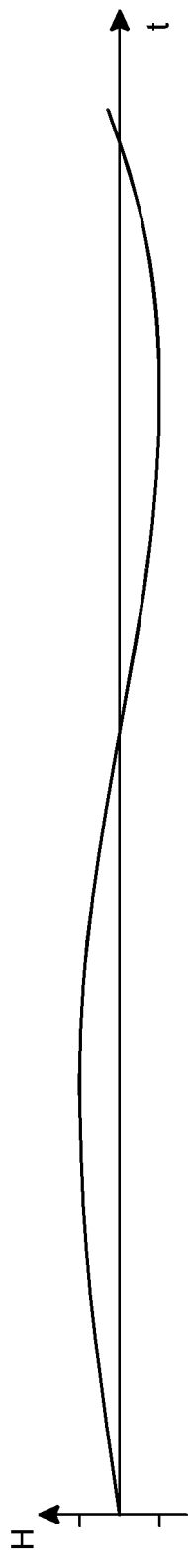
FIG. 30A is a graph showing a current representing an external magnetic field of a differential magnetic sensor of FIG. 29 on the vertical axis and time on the horizontal axis having a sinusoidal curve.
Figure 30B:
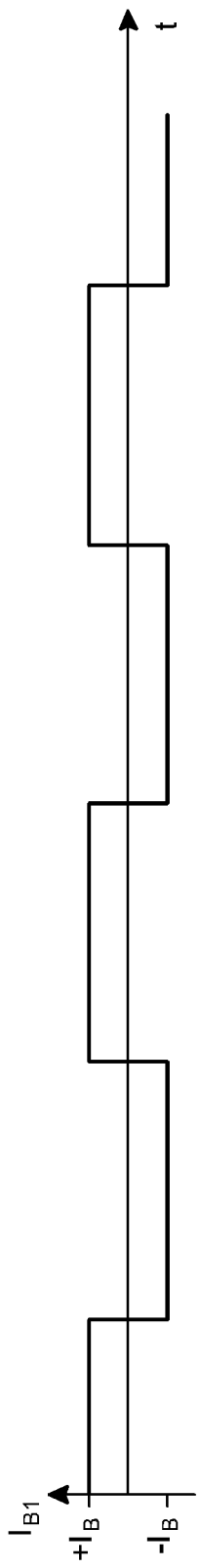
FIG. 30B is a graph
Figure 30C:
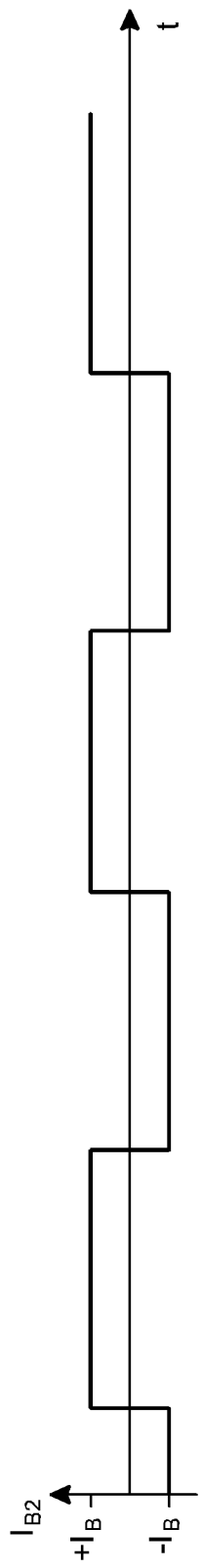
FIG. 30C is a graph showing a first bias current in a second biasing conductor of the differential magnetic sensor on the vertical axis and the time on the horizontal axis.
Figure 30D:
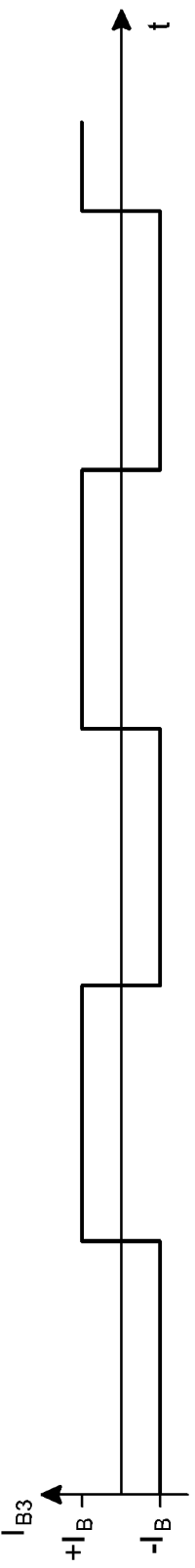
FIG. 30D is a graph showing a first bias current in a third biasing conductor of the differential magnetic sensor on the vertical axis and the time on the horizontal axis.

FIGS. 30A-30D show graphs that correspond to the operation of the differential magnetic sensor of FIG. 29. FIG. 30A is a graph showing a current intensity of a current representing an external magnetic field on the vertical axis and time on the horizontal axis having a sinusoidal curve. FIG. 30B is a graph showing a first bias current in the first biasing conductor 432 on the vertical axis and time on the horizontal axis. FIG. 30C is a graph showing a second bias current in the first biasing conductor 435 on the vertical axis and time on the horizontal axis. FIG. 30D is a graph showing a third bias current in the first biasing conductor 438 on the vertical axis and time on the horizontal axis. The time in the horizontal axes on FIGS. 30A-30D share the same time frame.

Figure 31A:
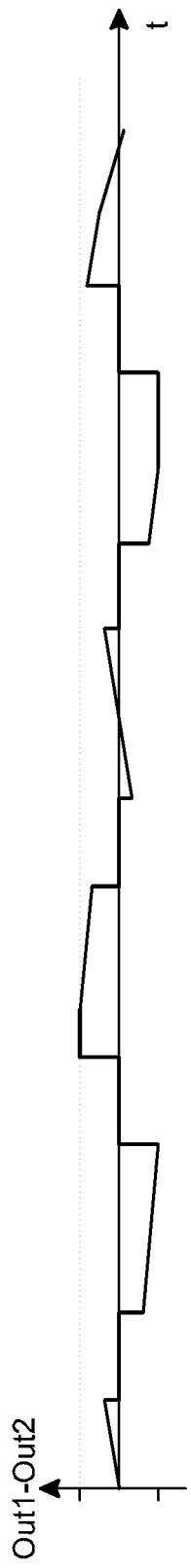
FIG. 31A is a graph showing a difference in currents at a first output and a second output over time of the differential magnetic field sensor of FIG. 29.
Figure 31B:
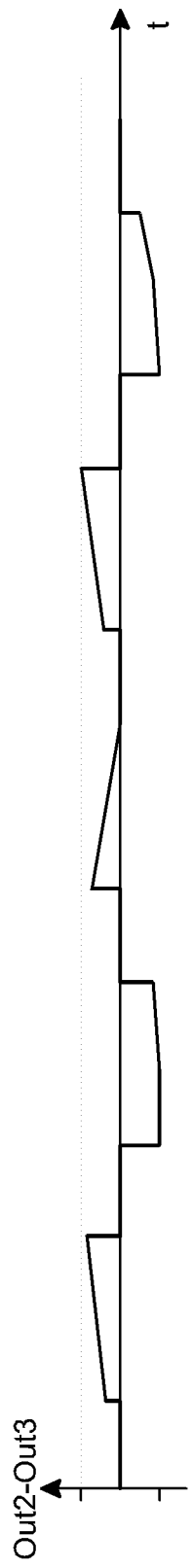
FIG. 31B is a graph showing a difference in currents the second output and a third output over time of the differential magnetic field sensor of FIG. 29.
Figure 31C:
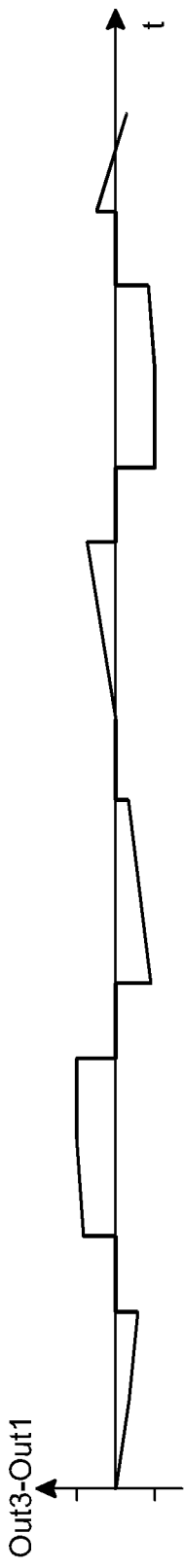
FIG. 31C is a graph showing a difference in currents at the third output and the first output over time of the differential magnetic field sensor of FIG. 29.

FIGS. 31A-31C are graphs showing a difference in current between the various outputs of the differential magnetic field sensor of FIG. 29 over the same time frame. FIG. 31A shows the difference in currents at the first output Out1 and the second output Out2 over time. FIG. 31B shows the difference in currents at the second output Out2 and the third output Out3 over time. FIG. 31C shows the difference in currents at the third output Out3 and the first output Out1 over time.

FIGS. 32A and 32B are two timing diagrams showing the timings for calibration and signals used for the same time frame. FIG. 32C shows an output voltage of a magnetic sensing system for the same time frame. As can be seen from FIGS. 32A and 32 B, when two of the outputs of the differential magnetic sensor of FIG. 29 are being used for current measurement, the other output can be calibrated relative to one of the two outputs. For example, when the first and third outputs Out1 and Out3 are used, the second output Out2 can be flipped. Further, an offset calibration between the second and third outputs Out2 and Out3 occurs while other combinations of the outputs are used in measurement.

Figure 33:
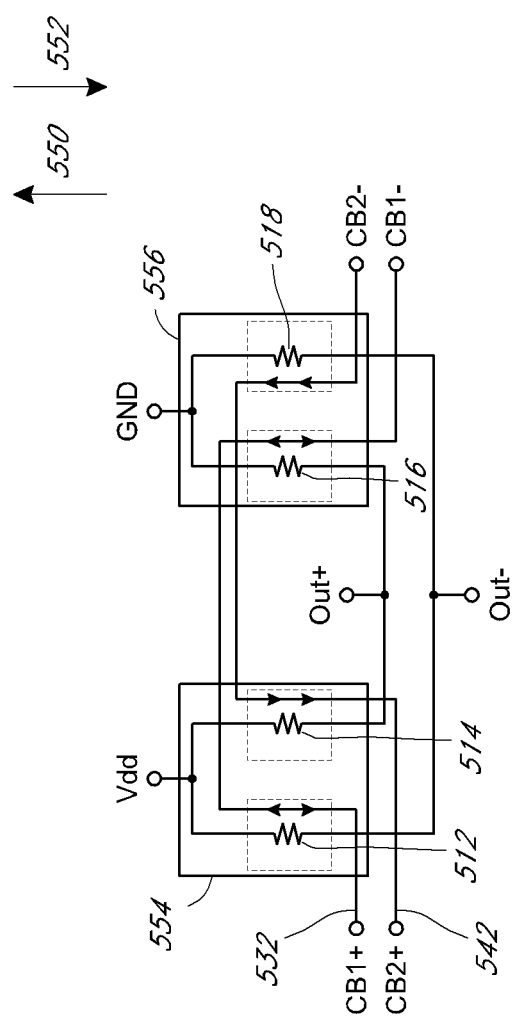
FIG. 33 is a schematic diagram of a differential magnetic field sensor that includes combined biasing and compensation conductors according to an embodiment.

FIG. 33 is a schematic diagram of a differential magnetic field sensor that includes combined biasing and compensation conductors 532 and 542 according to an embodiment. As illustrated, the differential magnetic field sensor includes first to fourth magnetoresistive elements 512, 514, 516 and 518, a first biasing and compensation conductor 532, and a second biasing and compensation conductor 542. In FIG. 33, the biasing and compensation conductors 532 and 542 can carry combined compensation and biasing currents in which a bias current and a compensation current are superimposed. As illustrated in FIG. 33, at a point of time, the current flow direction of the bias current and the compensation current in the first combined conductor 532 adjacent to the first and third elements 512 and 516 are opposite. In contrast, at the point of time, the current flow direction of the bias current and the compensation current in the second combined conductor 542 adjacent to the second and fourth elements 514 and 518 are the same. In this embodiment, the differential magnetic field sensor can be smaller than a sensor with separate conductors for the bias and compensation currents (e.g., the embodiment shown in FIG. 21), because bias current and compensation current can be provided in one conductor. Alternatively or additionally, in the embodiment of FIG. 33, there can be no significant overall change in current consumption during making an offset to zero. For example, to make the offset to zero in a measurement of an external magnetic field, the current for one of the combined conductors 532 and 542 can be reduced while the current for the other combined conductors 532 and 542 is increased.

Although certain embodiments of magnetic field sensors and differential magnetic field sensors are described herein, any suitable principles and advantages discussed herein can be implemented in combination with each other. Moreover, while embodiments of magnetic field sensors and differential magnetic field sensors may include full bridges, any suitable principles and advantages discussed herein can be implemented in connection with a half bridge and/or in a sensor with more than two half bridges.

Figure 34:
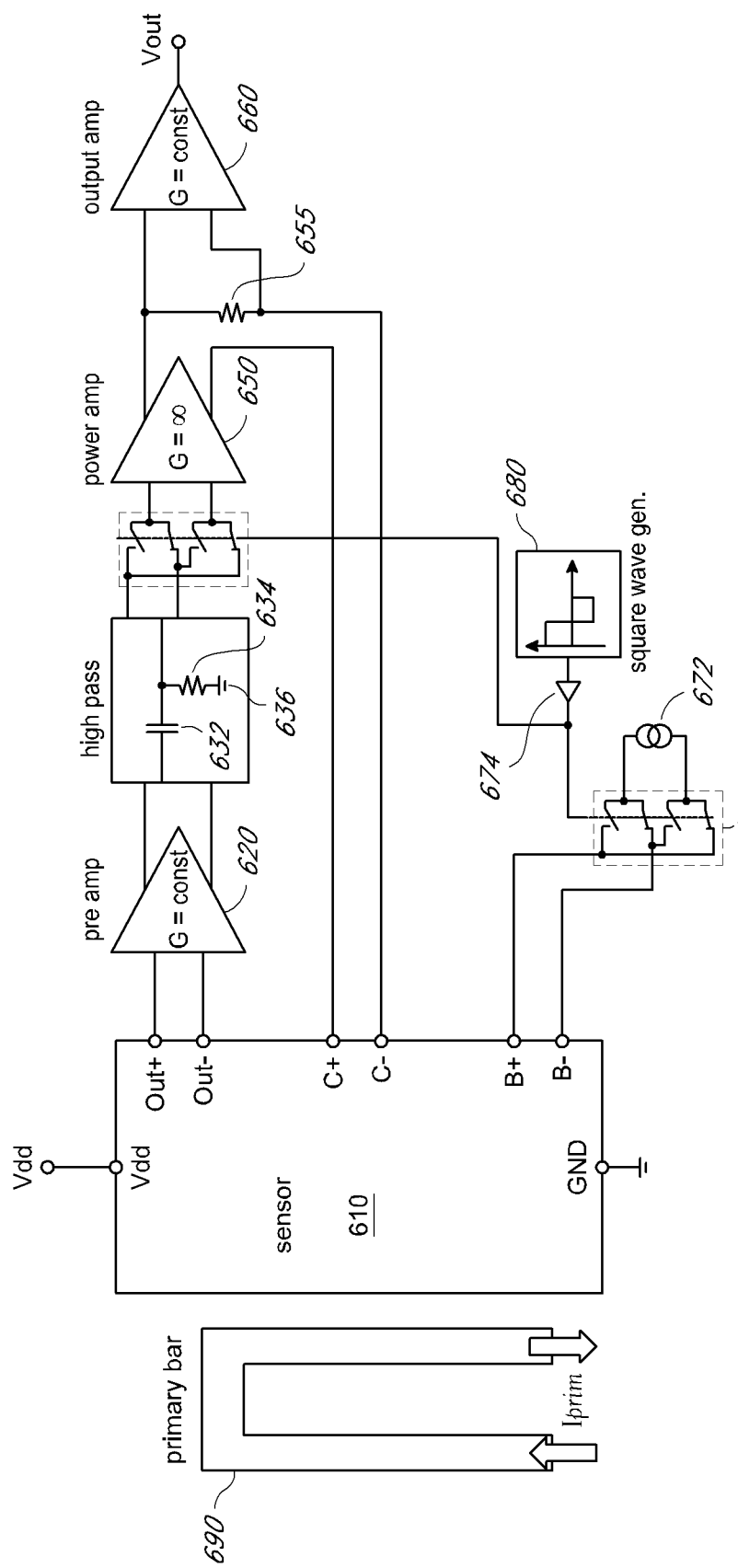
FIG. 34 is a schematic diagram of a magnetic field sensing system according to an embodiment.

FIG. 34 is a schematic diagram of a magnetic field sensing system according to an embodiment. The magnetic field sensing system includes a differential magnetic field sensor 610. The differential magnetic field sensor 610 can be implemented by the differential magnetic field sensor of FIG. 21, FIG. 27, or FIG. 28, for example. A bias current circuit can continuously switch a bias current from being positive to negative during operation. For example, switches 670 can change the polarity of the current provided by the bias current source 672 based on an output provided by a square wave generator 680, which can be provided by way of an inverter 674. Any kind of differential field, such as a differential field generated by the primary current bar 690, having a lower frequency than the bias current switching can be transferred to an alternating current (AC) output Out+/Out−. The output signal can be pre-amplified by preamplifier 620. The primary current bar 690 can be physically located below the sensor 610. The preamplifier 620 can have a substantially constant transconductance G.

The direct current (DC) portion of an output of the preamplifier 620 can be removed by a high pass filter 631. As illustrated, the high pass filter 631 can include a DC blocking capacitor 632 and a shunt resistor 634. The filtering can reduce and/or eliminate the DC offset of the sensor 610 and the DC offset of the pre-amplifier 620. The output of the high pass filter 631 can be rectified using a cross switch 641 that is switched at the same frequency as the current switching. As shown in FIG. 34, the cross switch 641 and the switches 670 can be switched by the same control signal.

The cross switch 641 can provide the original output signal. The output of the cross switch 641 signal can be amplified by the amplifier 650 and provided to the compensation conductor of the sensor 610. Accordingly, the compensation current can be based on an output of the sensor 610. The compensation conductor can reduce the field on the xMR resistor to approximately zero. The differential field can be proportional to the current flowing through the compensation conductor. An output amplifier 660 can provide an output voltage Vout representative of the differential magnetic field. A resistor 655 can be coupled across inputs of the output amplifier 660.

Figure 35:
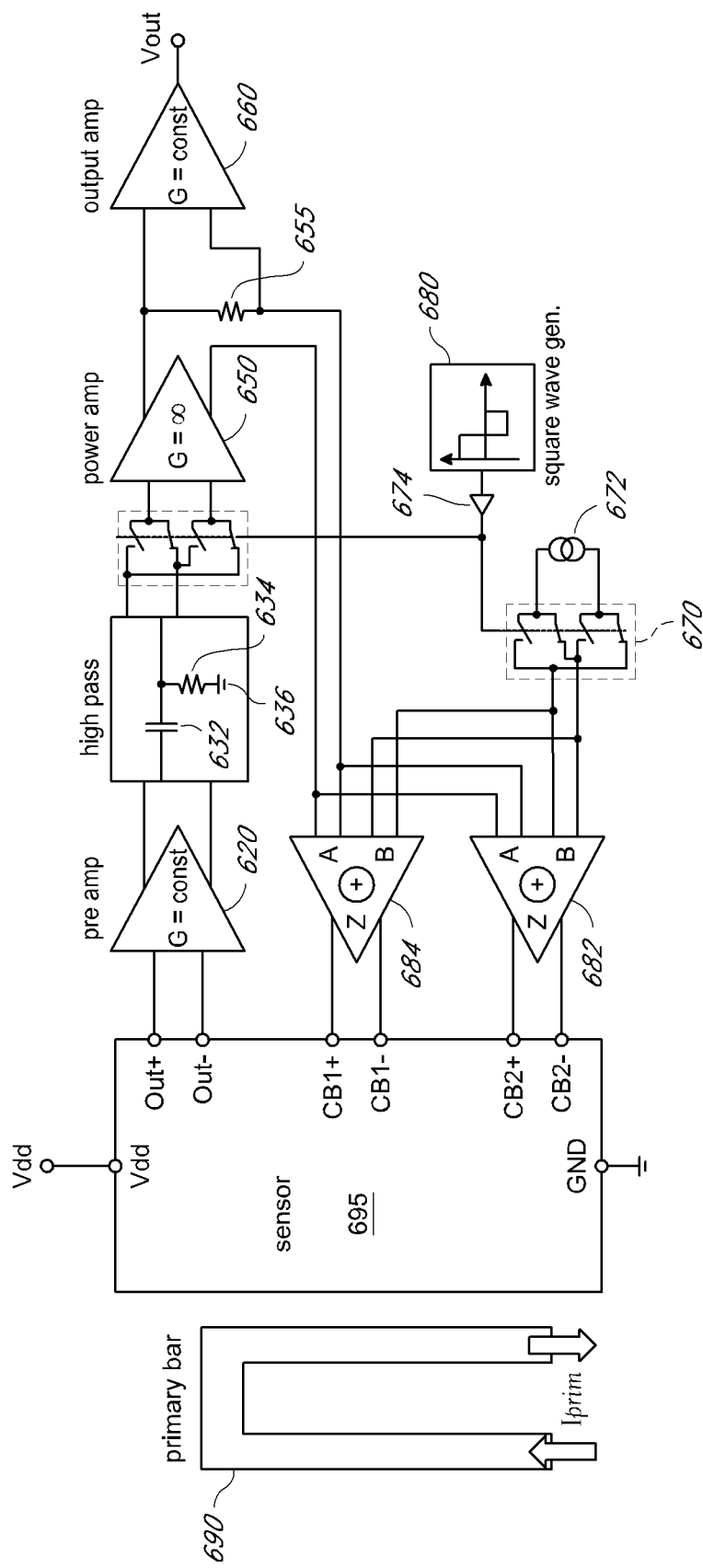
FIG. 35 is a schematic diagram of a magnetic field sensing system according to another embodiment.

FIG. 35 is a schematic diagram of a magnetic field sensing system according to another embodiment. The magnetic field sensing system of FIG. 35 is like the magnetic field sensing system of FIG. 34 except that superimposed bias and compensation currents are provided to a differential magnetic field sensor 695. The differential magnetic field sensor 395 can be implemented by the differential magnetic field sensor of FIG. 33, for example. Combining circuits 682 and 684 can combine a bias current and a compensation current. These combined currents can be provided to combined biasing and compensation conductors. The combined currents can flow in the directions as shown in FIG. 33 and opposite directions when the biasing and compensation currents are flipped.

Figure 36:
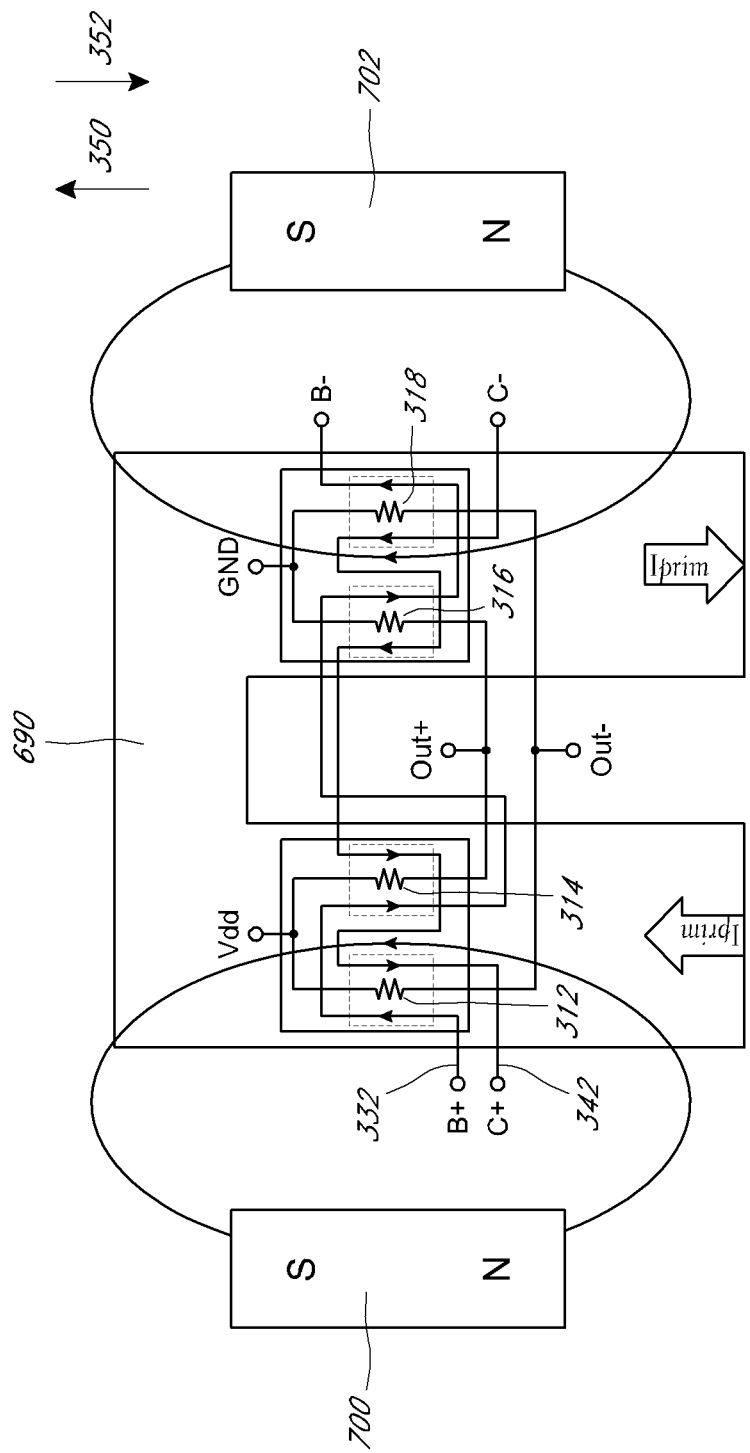
FIG. 36 shows a current measurement system according to an embodiment.

FIG. 36 shows a current measurement system according to an embodiment. The illustrated current measurement system includes a primary U-shaped bar 690 arranged to generate a differential magnetic field in a U-shape, two additional magnets 700 and 702 arranged to generate an additional bias field in a long direction of magnetoresistive elements 312, 314, 316, and 318 and the differential field sensor 360 as shown in FIG. 21.

In the current sensor of FIG. 36, a current is supplied in the primary bar 690 from a bottom-left side flowing upwardly 350, then at a top, the current flows to the right in the drawing, and on a right side, the current flows downwardly 352. In this embodiment, the current flow generates a magnetic field pointing from the left to the right in the drawing at the first portion 354, and magnetic field pointing from the right to the left at the second portion 356. When there is a differential magnetic field generated by the primary bar 690, the magnetic field can be sensed by the sensor. This embodiment can be implemented without a shield for an external magnetic field.

Aspects of this disclosure can be implemented in various electronic devices. For instance, aspects of this disclosure can be implemented in any electronic device or electronic component that could benefit from a magnetoresistive sensor. As an example, aspects of this disclosure can be implemented in any electronic device or electronic component that could benefit from a magnetoresistive sensor. Examples of the electronic devices can include, but are not limited to, consumer electronic products, parts of the consumer electronic products, electronic test equipment, vehicular electronics systems, etc. Examples of the electronic devices can include, but are not limited to, computing devices, communications devices, electronic household appliances, automotive electronics systems, etc. Further, the electronic devices can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. Where the context permits, the word "or" in reference to a list of two or more items is intended to cover all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components may be present in an actual embodiment (assuming that the functionality of the depicted circuits is not adversely affected).

As used herein, the term "substantially" intends that the modified characteristic needs not be absolute, but is close enough so as to achieve the advantages of the characteristic.

The various operations of methods described above may be performed by any suitable means capable of performing the operations, such as various hardware and/or software component(s), circuits, and/or module(s). Generally, any operations illustrated in the figures may be performed by corresponding functional means capable of performing the operations.

The methods disclosed herein comprise one or more operations or actions for achieving the described method. The method steps and/or actions may be interchanged with one another without departing from the scope of the claims. In other words, unless a specific order of operations or actions is specified, the order and/or use of specific operations and/or actions may be modified without departing from the scope of the claims.

It is to be understood that the implementations are not limited to the precise configuration and components illustrated above. Various modifications, changes and variations may be made in the arrangement, operation and details of the methods and apparatus described above without departing from the scope of the implementations.

Although innovations have been described in terms of certain embodiments, other embodiments that are apparent to those of ordinary skill in the art, including embodiments that do not provide all of the features and advantages set forth herein, are also within the scope of this disclosure. Moreover, the various embodiments described above can be combined to provide further embodiments. In addition, certain features shown in the context of one embodiment can be incorporated into other embodiments as well.

Various embodiments have been described above. Although described with reference to these specific embodiments, the descriptions are intended to be illustrative and are not intended to be limiting. Various modifications and applications may occur to those skilled in the art.

The claims presented here are in single dependency format suited for presentation at the USPTO. However for other jurisdictions where multiply dependent claims can be presented without a claims fee penalty, it is to be understood that each claim may depend on any preceding claim of a same or similar claim type, except where that is clearly not technically feasible.

What is claimed is:

1. A magnetic field sensor comprising:
   a first magnetoresistive element and a second magnetoresistive element arranged as a half bridge; and
   two or more conductors adjacent to the first magnetoresistive element and the second magnetoresistive element, the two or more conductors configured to carry a bias current and a compensation current such that the bias current and the compensation current flow in the same direction adjacent to the first magnetoresistive element while the bias current and the compensation current flow in opposite directions adjacent to the second magnetoresistive element.

2. The magnetic field sensor of claim 1, wherein the magnetic field sensor is configured to sense a magnetic field.

3. The magnetic field sensor of claim 1, wherein the magnetic field sensor is configured to sense a differential magnetic field.

4. The magnetic field sensor of claim 1, wherein the two or more conductors comprise a first conductor configured to carry the bias current and a second conductor configured to carry the compensation current.

5. The magnetic field sensor of claim 4, wherein the first magnetoresistive element and the second magnetoresistive element are included in a magnetoresistive layer, and wherein the first conductor and the second conductor are disposed on opposing sides of the magnetoresistive layer.

6. The magnetic field sensor of claim 1, wherein the first magnetoresistive element includes a pair of spaced apart sub-magnetoresistive elements on two sides of the magnetic field sensor.

7. The magnetic field sensor of claim 1, further comprising:
   a third magnetoresistive element and a fourth magnetoresistive element arranged as a second half bridge;
   wherein the two or more conductors comprise a second half bridge biasing conductor configured to carry a second half bridge biasing current.

8. The magnetic field sensor of claim 7, further comprising:
   a fifth magnetoresistive element and a sixth magnetoresistive element arranged as a third half bridge;
   wherein the two or more conductors comprise a third half bridge biasing conductor configured to carry a third half bridge biasing current; and
   wherein the magnetic field sensor is arranged to sense a magnetic field with outputs from the half bridge and the second half bridge while the third half bridge is being calibrated.

9. The magnetic field sensor of claim 1, wherein the two or more conductors comprise:
   a first conductor configured to carry a first combined current that includes a first combination of the bias current and the compensation current in which the bias current and the compensation current flow in the same direction; and
   a second conductor configured to carry a second combined current that includes a second combination of the bias current and the compensation current in which the bias current and the compensation current flow in opposite directions.

10. The magnetic field sensor of claim 1, wherein the two or more conductors are arranged such that both the bias current and the compensation current flow along a longitudinal direction of the first magnetoresistive element.

11. The magnetic field sensor of claim 1, further comprising a third magnetoresistive element and a fourth magnetoresistive element; wherein the first magnetoresistive element, the second magnetoresistive element, the third magnetoresistive element, and the fourth magnetoresistive element are arranged as a full bridge.

12. The magnetic field sensor of claim 1, wherein the first magnetoresistive element is an anisotropic magnetoresistance element.

13. A method of detecting a magnetic field, the method comprising:
   using the magnetic field sensor of claim 1,
      biasing, using at least a first conductor of the two or more conductors, the first magnetoresistive element and the second magnetoresistive element of the half bridge with at least the bias current such that the first magnetoresistive element has an opposite field sensitivity relative to the second magnetoresistive element;
      applying, using at least a second conductor of the two or more conductors, the compensation current to perform a field compensation of the half bridge for linearization; and
      detecting a magnetic field using the half bridge based at least in part on the biasing and the applying.

14. The method of claim 13, further comprising biasing, using at least the first conductor of the two or more conductors, a third magnetoresistive element and a fourth magnetoresistive element of a second half bridge of the magnetic field sensor such that the third magnetoresistive element has an opposite field sensitivity relative to the fourth magnetoresistive element.

15. The method of claim 13, wherein the applying the compensation current brings an offset of an output of the half bridge to approximately zero.

16. A magnetic field sensing system comprising:
a magnetic field sensor comprising:
- a first magnetoresistive element and a second magnetoresistive element arranged as a half bridge; and
- two or more conductors configured to carry a bias current and a compensation current such that the bias current and the compensation current flow in the same direction adjacent to the first magnetoresistive element while the bias current and the compensation current flow in opposite directions adjacent to the second magnetoresistive element; and a bias current generating circuit configured to generate the bias current such that the bias current flips polarity during operation; and a compensation current generating circuit configured to generate the compensation current.

17. The magnetic field sensing system of claim 16, wherein the compensation current generating circuit is configured to flip polarity of the compensation current at times corresponding to times when the bias current flips polarity.

18. The magnetic field sensing system of claim 16, further comprising a combining circuit configured to combine the bias current and the compensation circuit to generate a combined current and to provide the combined current to the magnetic field sensor.

19. The magnetic field sensing system of claim 16, wherein the first magnetoresistive element includes a pair of spaced apart sub-magnetoresistive elements on two sides of the magnetic field sensor system.

20. A magnetic field sensor comprising:
- a first magnetoresistive element and a second magnetoresistive element arranged as a half bridge; and
- means for carrying a bias current and a compensation current such that the bias current and the compensation current flow in the same direction adjacent to the first magnetoresistive element while the bias current and the compensation current flow in opposite directions adjacent to the second magnetoresistive element.

\* \* \* \* \*